(12) United States Patent
Ootorii et al.

(10) Patent No.: US 9,164,182 B2
(45) Date of Patent: Oct. 20, 2015

(54) IMAGE PICKUP PANEL AND IMAGE PICKUP PROCESSING SYSTEM

(71) Applicant: Sony Corporation, Tokyo (JP)

(72) Inventors: Hiizu Ootorii, Kanagawa (JP); Norihisa Shirota, Chiba (JP); Haruo Togashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/362,240

(22) PCT Filed: Dec. 7, 2012

(86) PCT No.: PCT/JP2012/082436
§ 371 (c)(1),
(2) Date: Jun. 2, 2014

(87) PCT Pub. No.: WO2013/089209
PCT Pub. Date: Jun. 20, 2013

(65) Prior Publication Data
US 2014/0326892 A1   Nov. 6, 2014

(30) Foreign Application Priority Data
Dec. 15, 2011   (JP) .................. 2011-274780

(51) Int. Cl.
*G01T 1/20* (2006.01)
*G01T 1/202* (2006.01)
*H01L 27/146* (2006.01)

(52) U.S. Cl.
CPC ............. *G01T 1/202* (2013.01); *G01T 1/2006* (2013.01); *H01L 27/14663* (2013.01)

(58) Field of Classification Search
CPC .................. G01T 1/2018; G01T 1/247
USPC .......................................... 250/366
See application file for complete search history.

(56) References Cited

U.S. PATENT DOCUMENTS

| 8,798,229 B2 * | 8/2014 | Li et al. ........................... 378/19 |
| 2003/0031353 A1 * | 2/2003 | Baertsch et al. ............... 382/132 |
| 2004/0016886 A1 * | 1/2004 | Ringermacher et al. . 250/370.11 |
| 2010/0123081 A1 * | 5/2010 | Shibayama ............... 250/361 R |
| 2010/0260313 A1 | 10/2010 | Kudo et al. |
| 2012/0132817 A1 | 5/2012 | Shaw et al. |

FOREIGN PATENT DOCUMENTS

| GB | 2426576 A | 11/2006 |
| GB | 2451447 A | 2/2009 |
| JP | 2000-253313 A | 9/2000 |
| JP | 2001-318155 A | 11/2001 |
| JP | 2006-004991 A | 1/2006 |
| JP | 2007-105112 A | 4/2007 |

(Continued)

*Primary Examiner* — Kiho Kim
(74) *Attorney, Agent, or Firm* — Wolf, Greenfield & Sacks, P.C.

(57) ABSTRACT

An image pickup panel (1) includes: photodetection sections (10) each including a photodetector (11-1) and a receiver (11-2) which are integrally molded and having solder bumps (12) formed thereon, the photodetector converting received light into a current signal, the. receiver converting the current signal into a voltage signal; and a wiring layer (20) including a wiring pattern installed therein and allowing the photodetection sections to be mounted thereon for respective pixels by the solder bumps, the wiring pattern being connected to the photodetection sections.

12 Claims, 31 Drawing Sheets

(56) References Cited

FOREIGN PATENT DOCUMENTS

| JP | 2007-228347 A | 9/2007 |
| JP | 2008-200358 A | 9/2008 |
| JP | 2010-085121 A | 4/2010 |
| JP | 2011-243749 A | 12/2011 |
| WO | WO 2008/052965 A1 | 5/2008 |
| WO | WO 2009/014155 A1 | 1/2009 |
| WO | WO 2010/079251 A1 | 7/2010 |

* cited by examiner

S16

S17

IMAGE PICKUP PANEL AND IMAGE PICKUP PROCESSING SYSTEM

TECHNICAL FIELD

The present disclosure relates to an image pickup panel performing image pickup, and an image pickup processing system performing image pickup processing.

BACKGROUND ART

X-ray radiography is imaging inspection technology of seeing an interior of a human body or an object through irradiating the human body or the object with X-rays and detecting X-rays passing through or reflected by the human body or the object to visualize the interior of the human body or the object.

In transmission X-ray detection in related art, photographic plates and photograph films are frequently used; however, in recent years, flat panel X-ray image sensors in which a flat panel is formed with use of LTPS (Low Temperature Poly Silicon) as a base has been developed.

The flat panel X-ray image sensors are classified into two major systems: a direct conversion system and an indirect conversion system. In the direct conversion system, X-rays including information of an interior of a human body or an object passing through or being reflected by the human body or the object are directly converted into electrical signals, and in the indirect conversion system, the X-rays are converted first into optical signals, and then into electrical signals.

In both of the systems, filmless radiography is achievable, and an improvement in image quality and diagnosis support with use of digital image processing are achievable. Moreover, such systems have advantages including easy electronic filing and easy networking, and are expected to be used in various fields.

In related art, an X-ray image pickup panel in which an X-ray absorption rate is increased through adopting a two-photoconductive-layer configuration is proposed.

CITATION LIST

Patent Literature

PTL 1: Japanese Unexamined Patent Application Publication No. 2000-253313

SUMMARY OF INVENTION

However, an X-ray image pickup panel used in a flat panel X-ray image sensor in related art has a large restriction on formation of an X-ray conversion film, and it is difficult to form a desired crystalline film with a certain size of area without causing a crystal defect. Therefore, in the X-ray image pickup panel in related art, it is difficult to increase an area thereof without causing a defect.

It is desirable to provide an image pickup panel capable of increasing an area thereof.

Moreover, it is desirable to provide an image pickup processing system including an image pickup panel capable of increasing an area thereof.

According to an embodiment of the disclosure, there is provided an image pickup panel including: photodetection sections each including a photodetector and a receiver which are integrally molded and having solder bumps formed thereon, the photodetector converting received light into a current signal, the receiver converting the current signal into a voltage signal; and a wiring layer including a wiring pattern installed therein and allowing the photodetection sections to be mounted thereon for respective pixels by the solder bumps, the wiring pattern being connected to the photodetection sections.

According to an embodiment of the disclosure, there is provided an image pickup processing system including: an image pickup panel including photodetection sections and a wiring layer, the photodetection sections each including a photodetector and a receiver which are integrally molded and having solder bumps formed thereon, the photodetector converting received light into a current signal, the receiver converting the current signal into a voltage signal, the wiring layer including a wiring pattern installed therein and allowing the photodetection sections to be mounted thereon for respective pixels by the solder bumps, the wiring pattern being connected to the photodetection sections; and an image processing section including an A/D section converting the voltage signal into a digital signal, a signal processing section performing signal processing on the digital signal, and a display control section performing display control on signal-processed image information.

An increase in area of the panel is achievable.

It is to be understood that both the foregoing general description and the following detailed description are exemplary, and are intended to provide further explanation of the technology as claimed.

BRIEF DESCRIPTION OF DRAWINGS

The accompanying drawings are included to provide a further understanding of the technology, and are incorporated in and constitute a part of this specification. The drawings illustrate embodiments and, together with the specification, serve to explain the principles of the technology.

DESCRIPTION OF EMBODIMENTS

Figure 1:
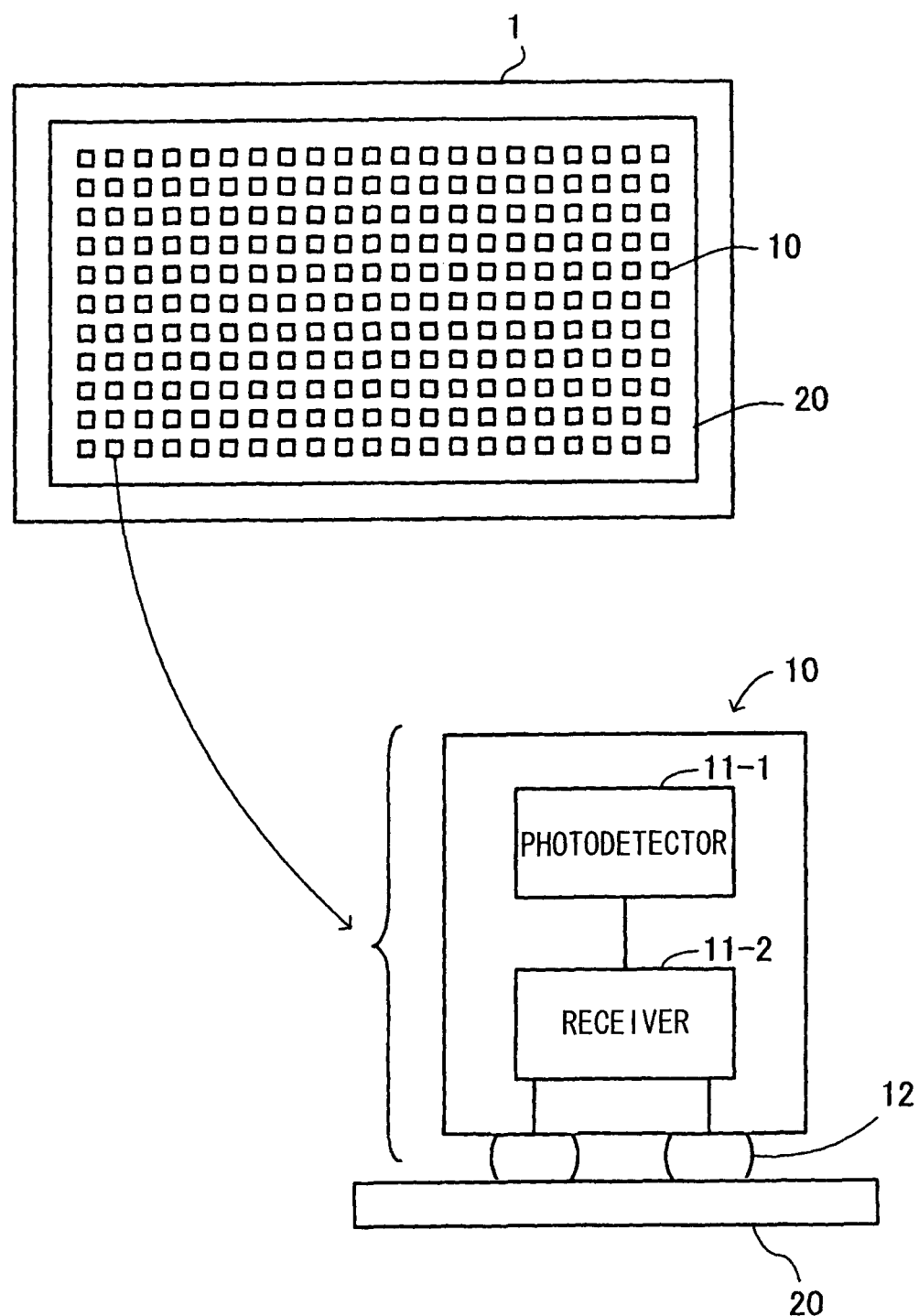
FIG. 1 is a diagram illustrating a configuration example of an image pickup panel.

Embodiments of the present disclosure will be described in detail below referring to the accompanying drawings. FIG. 1 is a diagram illustrating a configuration example of an image pickup panel. An image pickup panel 1 includes photodetection sections 10 and a wiring layer 20, and is, for example, a panel performing X-ray image pickup. It is to be noted that the image pickup panel 1 is not limited to an X-ray panel, and includes a typical imaging panel.

Each of the photodetection sections 10 includes a photodetector 11-1 (for example, a photodiode) and a receiver 11-2, and is a tiny photodetector chip (for example, a square chip with about 200 μm or less per side) in which the photodetector 11-1 and the receiver 11-2 are integrally molded of a resin for one pixel. Moreover, solder bumps 12 as protruded solder terminals are formed on the photodetection section 10.

The photodetector 11-1 converts received light into a current signal. The receiver 11-2 has an I/V conversion function, and converts the current signal into a voltage signal. A wiring pattern connecting the photodetection section 10 and an external processing section (for example, an A/D section) to each other is installed in the wiring layer 20, and the photodetection sections 10 are mounted for respective pixels on the wiring layer 20 by the solder bumps 12. For example, a flexible substrate is applied to the wiring layer 20.

Thus, in the image pickup panel 1, chips of the photodetection sections 10 each including the photodetector 11-1 converting light into a current signal and the receiver 11-2 converting the current signal into a voltage signal which are integrally molded, and having the solder bumps 12 formed thereon are arranged for respective pixels, and are mounted on the wiring layer 20 by FC bonding (flip chip bonding) with the solder bumps 12.

It is to be noted that, unlike wiring bonding, in the FC bonding, a chip surface and a substrate are electrically connected to each other through solder bumps arranged in an array instead of a wire.

With the above-described configuration, the image pickup panel 1 is able to increase the area thereof, and is able to be manufactured at low cost. It is to be noted that a specific configuration of the image pickup panel 1 will be described later referring to FIG. 8 and subsequent drawings.

Next, a configuration and issues of an X-ray image pickup panel used in a typical flat panel X-ray image sensor (hereinafter referred to as "FPD (Flat Panel Display)") will be described before describing the image pickup panel 1 according to an embodiment of the disclosure.

Figure 2:
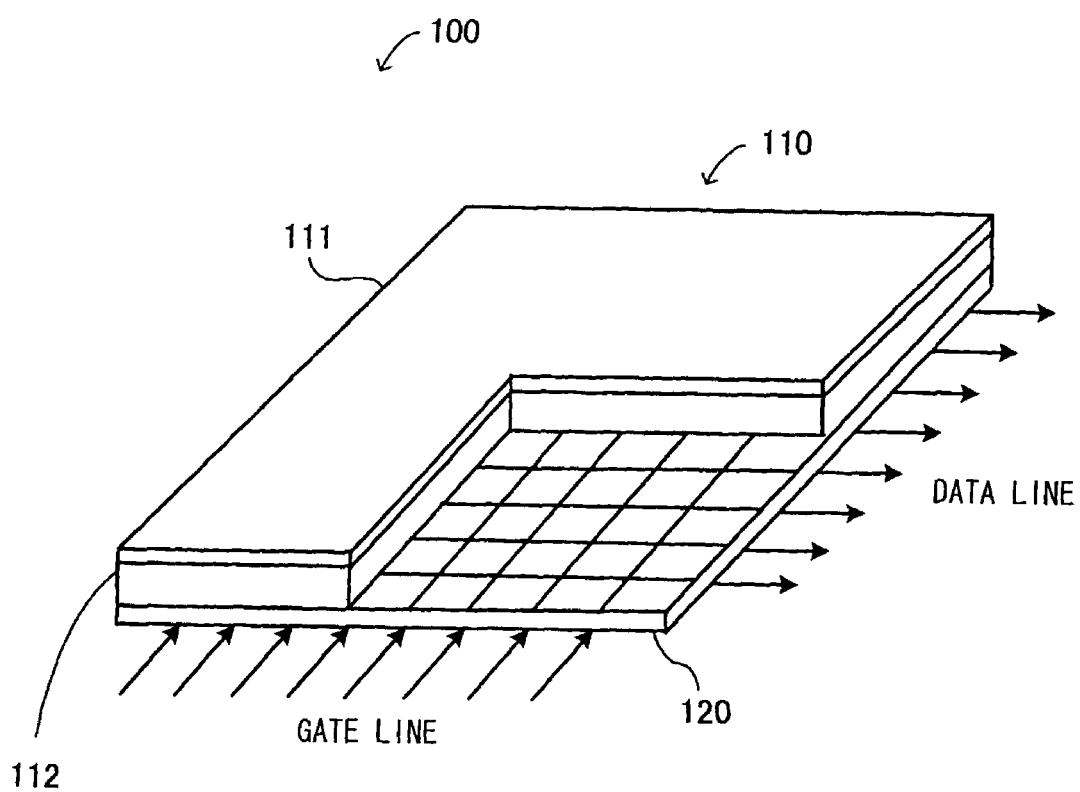
FIG. 2 is a diagram for describing an X-ray image pickup panel of a direct conversion FPD.
Figure 3:
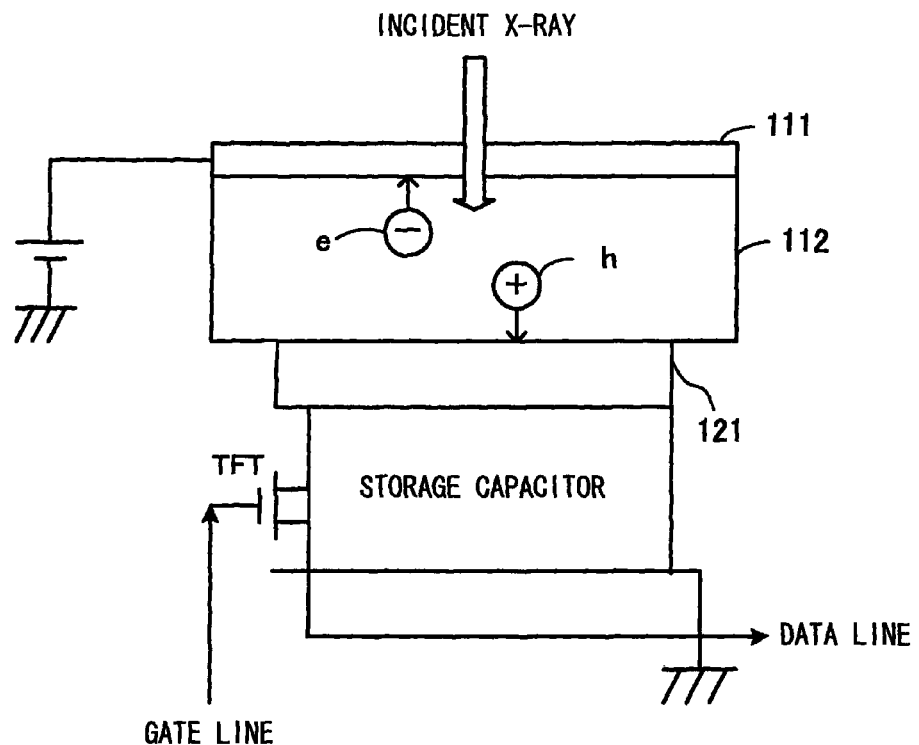
FIG. 3 is a diagram for describing the X-ray image pickup panel of the direct conversion FPD.
Figure 4:
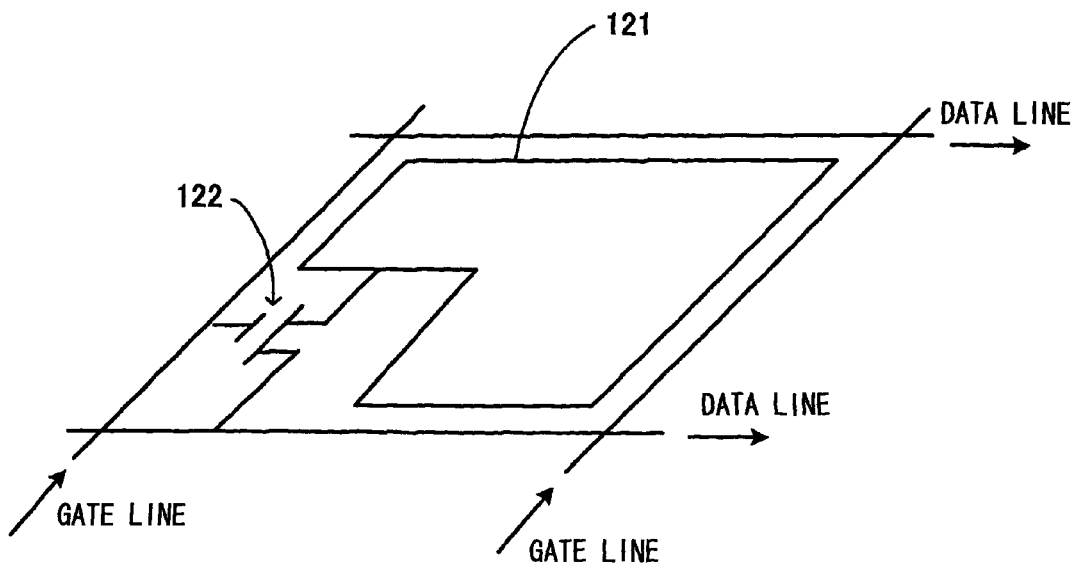
FIG. 4 is a diagram for describing the X-ray image pickup panel of the direct conversion FPD.

FIGS. 2 to 4 are diagrams for describing an X-ray image pickup panel of a direct conversion FPD. FIG. 2 illustrates a configuration of an X-ray image pickup panel 100 of the direct conversion FPD. The X-ray image pickup panel 100 includes an X-ray conversion section 110 and a TFT (Thin Film Transistor) array 120.

The X-ray conversion section 110 includes a bias electrode 111 and an X-ray conversion layer 112 formed of a semiconductor crystal such as amorphous selenium semiconductor (a-Se).

The TFT array 120 is located below the X-ray conversion section 110, and includes pixel regions separated in a matrix by data lines as lines where data including image information is transmitted and gate lines as lines where a drive signal for driving a TFT is transmitted.

As described above, the X-ray image pickup panel 100 has a panel configuration in which the bias electrode 111, the X-ray conversion layer 112, and the TFT array 120 are laminated.

FIG. 3 illustrates a direct conversion operation of the X-ray image pickup panel 100. X-rays emitted from an X-ray generator pass through or are reflected by an object such as a human body, and then enter the X-ray conversion layer 112. In the X-ray conversion layer 112, a charge (a pair of a hole and an electron) according to an incident X-ray dose is excited.

In this case, since a positive potential is given to the bias electrode 111, electrons e having a negative charge move toward the bias electrode 111, and holes h having a positive charge move toward a pixel electrode 121 located on the TFT array 120.

Then, the holes h moving toward the pixel electrode 121 are accumulated in a storage capacitor, and the storage capacitor is thus charged (the pixel electrode 121 is a storage capacitor storing a detection current).

FIG. 4 illustrates a configuration of a section corresponding to one pixel of the TFT array 120. Each of the pixel regions arranged in a matrix to form an image display region includes the pixel electrode 121 and a TFT 122 controlling switching of the pixel electrode 121.

A drain of the TFT 122 is connected to the pixel electrode 121. Moreover, a source of the TFT 122 is connected to the data line, and a gate of the TFT 122 is connected to the gate line.

When a drive signal is sequentially transmitted to a plurality of gate lines after taking a radiograph, a switch of the TFT 122 to which the drive signal is applied is closed, and a detection current accumulated in the storage capacitor of the pixel electrode 121 flows from the data line to be extracted. After that, image data is A/D converted by a subsequent processing section to be captured by a computer, and then an image is displayed.

Figure 5:
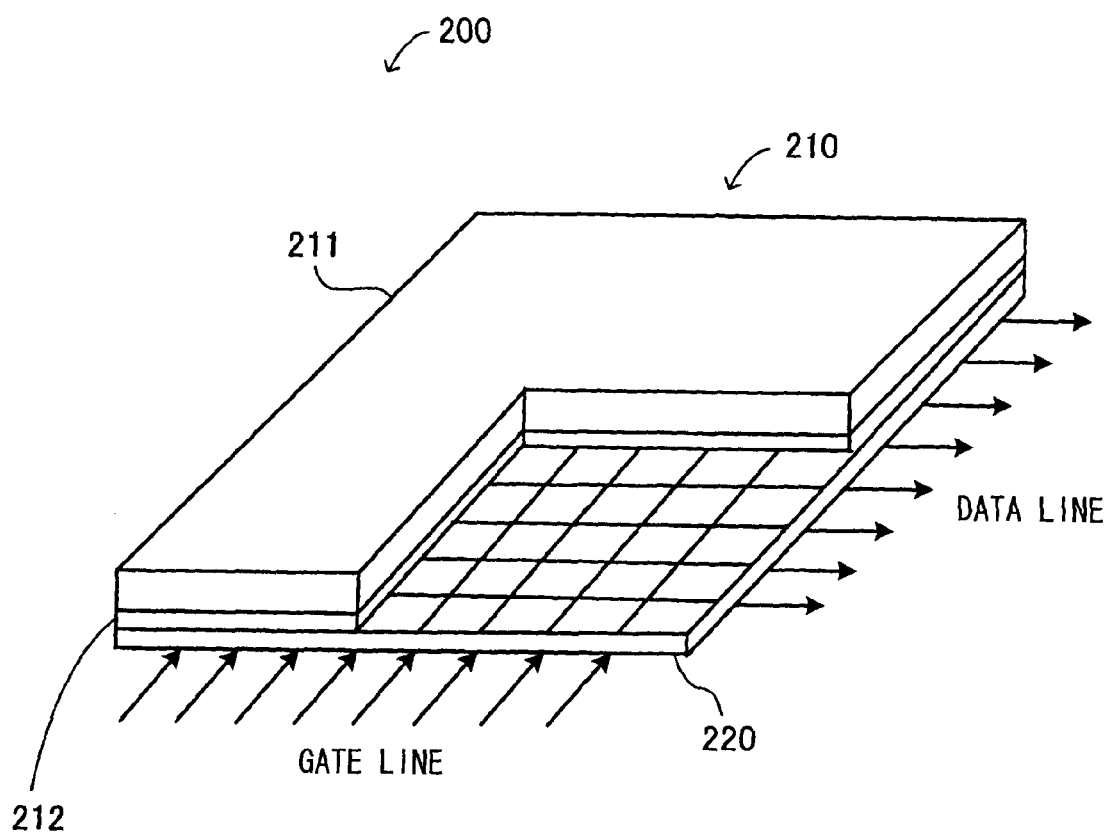
FIG. 5 is a diagram for describing an X-ray image pickup panel of an indirect conversion FPD.
Figure 6:
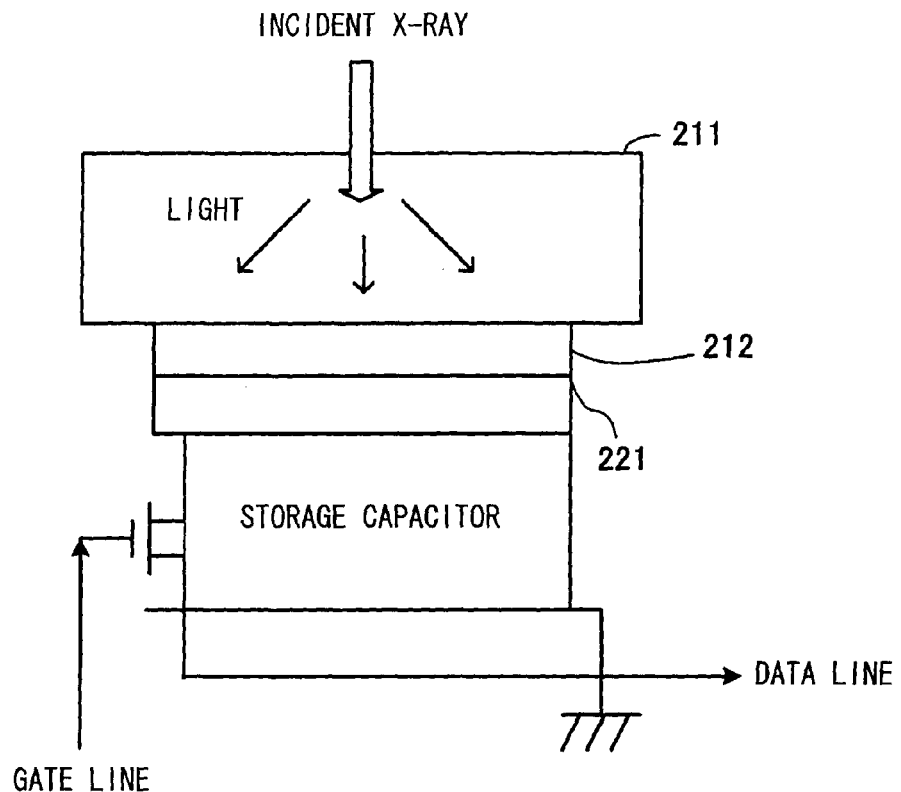
FIG. 6 is a diagram for describing the X-ray image pickup panel of the indirect conversion FPD.
Figure 7:
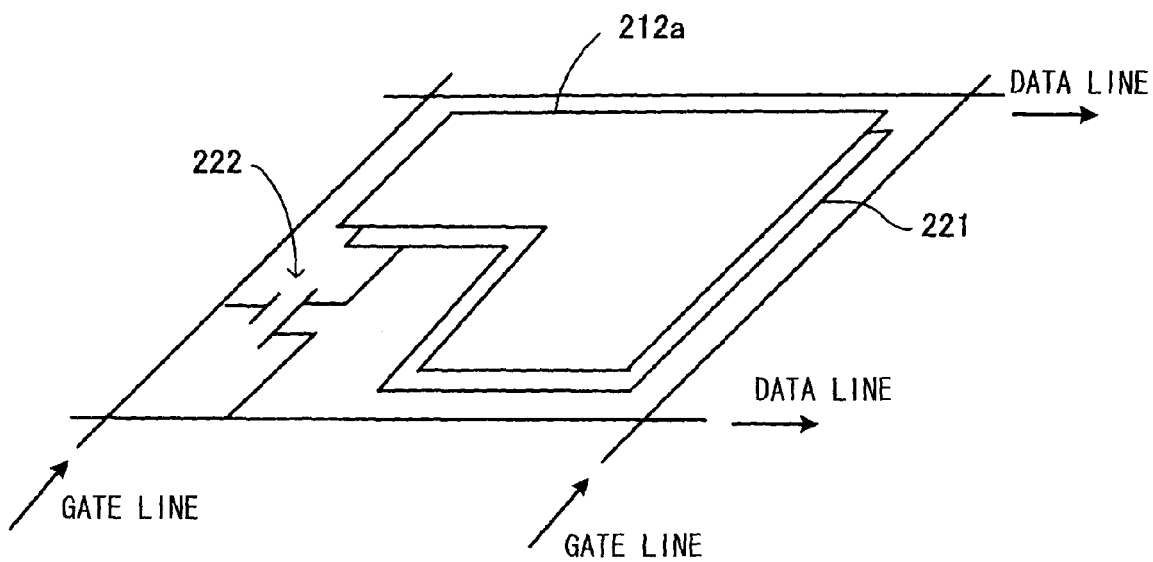
FIG. 7 is a diagram for describing the X-ray image pickup panel of the indirect conversion FPD.

Next, the X-ray image pickup panel of the indirect conversion FPD will be described below. FIGS. 5 to 7 are diagrams for describing the X-ray image pickup panel of the indirect conversion FPD. FIG. 5 illustrates a configuration of an X-ray image pickup panel 200 of the indirect conversion FPD. The X-ray image pickup panel 200 includes an X-ray conversion section 210 and a TFT array 220.

The X-ray conversion section 210 includes a scintillator 211 as a fluorescent medium and a photodiode array 212.

The TFT array 220 is located below the X-ray conversion section 210, and includes pixel regions separated in a matrix by data lines as lines where data including image information is transmitted and gate lines as lines where a drive signal for driving a TFT is transmitted.

The X-ray image pickup panel 200 has the above-described panel configuration in which the scintillator 211, the photodiode array 212, and the TFT array 220 are laminated.

FIG. 6 illustrates an indirect conversion operation of the X-ray image pickup panel 200. X-rays emitted from an X-ray generator passes through or are reflected by an object such as a human body, and then enter the scintillator 211.

The scintillator 211 converts incident X-rays into optical signals (optical outputs according to X-ray intensity; for example, green light as a wavelength). After that, the photodiode array 212 converts the intensity of each of the optical signals into an electrical signal representing the magnitude of a charge. A pixel electrode 221 located on the TFT array 220 receives the electrical signal, and charges a storage capacitor.

FIG. 7 illustrates a configuration of a section corresponding to one pixel of the TFT array 220. Each of the pixel regions arranged in a matrix to form an image display region includes the pixel electrode 221 and a TFT 222 controlling switching of the pixel electrode 221. It is to be noted that a state where a photodiode 212a for one pixel is located on a top surface of the pixel electrode 221 is illustrated in the drawing.

A drain of the TFT 222 is connected to the pixel electrode 221. Moreover, a source of the TFT 222 is connected to the data line, and a gate of the TFT 222 is connected to the gate line.

When a drive signal is sequentially transmitted to a plurality of gate lines after taking a radiograph, a switch of the TFT 222 to which the drive signal is applied is closed, and a detection current accumulated in the storage capacitor of the pixel electrode 221 flows from the data line to be extracted. After that, image data is A/D converted by a subsequent processing section to be captured by a computer, and then an image is displayed.

The above-described direct conversion X-ray image pickup panel 100 and the above-described indirect conversion X-ray image pickup panel 200 are manufactured through forming the TFT array on a glass substrate, and then forming a film on a circuit of the TFT array by high-temperature evaporation in a vacuum process.

Therefore, an influence of a base and restrictions on film formation temperature and the like are large. Accordingly, it is difficult to form a desired crystalline film with a certain size of area without causing a crystal defect, and a larger-scale expensive manufacturing apparatus is necessary.

Thus, in the X-ray image pickup panel in related art, it is extremely difficult to increase an area thereof without causing a defect, and the length of each side of a presently mass-produced largest panel is about 400 mm. Moreover, high cost is necessary for manufacturing.

Moreover, in both the above-described direct conversion X-ray image pickup panel 100 and the above-described indirect conversion X-ray image pickup panel 200, a signal propagates in a carrier form from the X-ray conversion section until reaching the TFT array, and wiring capacity of the TFT (wiring capacity of the data line in particular) is large; therefore, noise is easily generated.

The present disclosure is made to solve such issues, and provides an image pickup panel and an image pickup processing system which are capable of increasing an area thereof, reducing noise, and reducing manufacturing cost.

Next, the image pickup panel 1 according to the embodiment of the disclosure will be described in detail below. First, a configuration of the photodetection section 10 will be described below.

Figure 8:
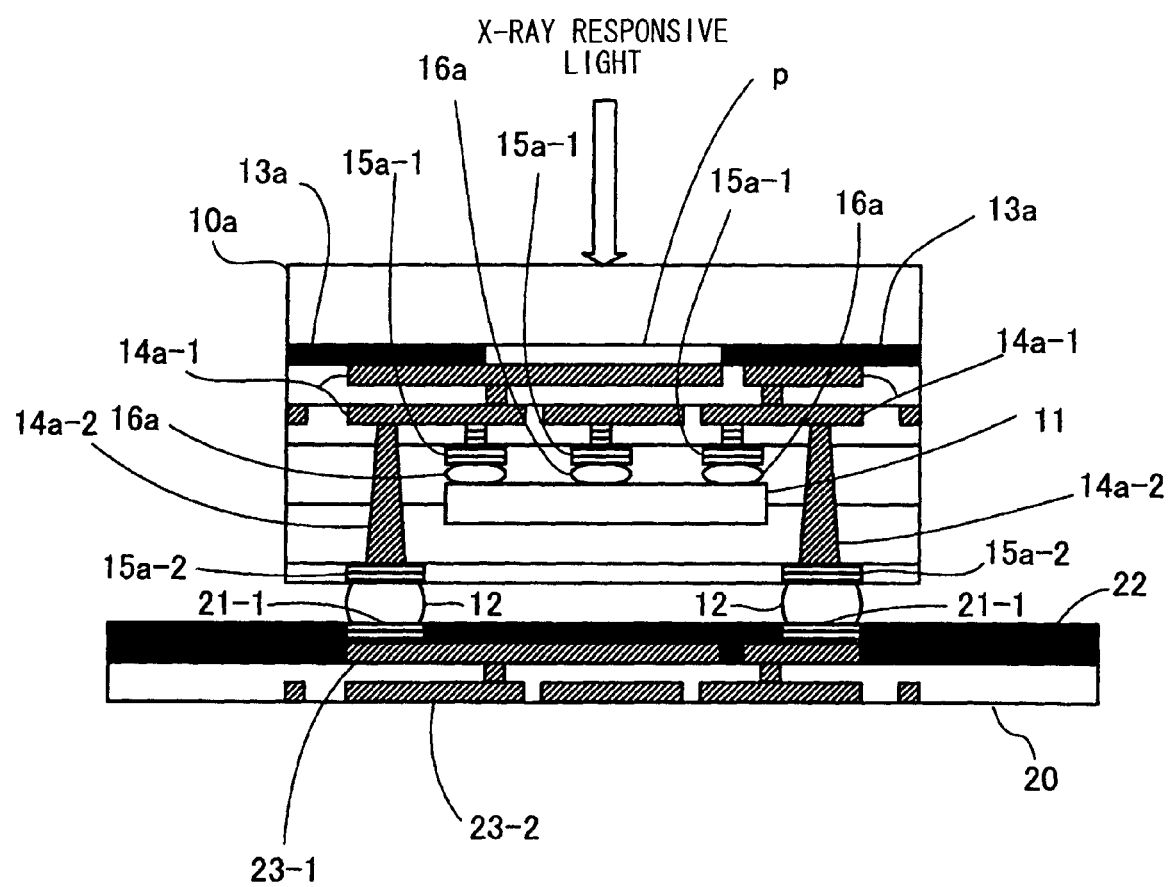
FIG. 8 is a diagram illustrating a state where a photodetection section for one pixel is mounted on a wiring layer.

FIG. 8 is a diagram illustrating a state where a photodetection section for one pixel is mounted on the wiring layer. A photodetection section 10a is a tiny photodetector chip molded of a resin for each pixel, and solder bumps 12 are formed on a mounting surface where the wiring layer 20 is mounted of the photodetection section 10a.

Moreover, the photodetection section 10a includes a photodetection IC (Integrated Circuit) 11 configured through integrating the photodetector 11-1 and the receiver 11-2 illustrated in FIG. 1 in one chip (in FIG. 8, the photodetector 11-1 and the receiver 11-2 are not illustrated).

Moreover, in addition to the photodetection IC 11, a light-shielding film 13a, a wiring pattern 14a-1, via holes 14a-2, UBMs (Under Bump Metallizations) 15a-1 and 15a-2, and solder bumps 16a are mounted in the photodetection section 10a.

The light-shielding film 13a allows surfaces except for a light-receiving surface p of the photodetection IC 11 to be shielded from light. The photodetection IC 11 is soldered with use of the solder bumps 16a, and is connected to the wiring pattern 14a-1 through the solder bumps 16a and the UBMs 15a-1.

It is to be noted that the UBM is a metal layer (for example, nickel) as a base of the solder bump for preventing the spread of solder and securing a favorable solder joint.

Moreover, the wiring pattern 14a-1 is connected to one end of each of the via holes 14a-2, and the other end of each of the via holes 14a-2 is connected to each of the UBMs 15a-2. It is to be noted that the via holes 14a-2 are filled with a conductive metal by, for example, via fill plating (if conduction is established, wiring by sputtering is applicable).

Then, the photodetection section 10a is FC bonded on UBMs 21-1 mounted on the wiring layer 20 through the solder bumps 12.

The wiring layer 20 includes UBMs 21-1 disposed at soldering positions and, the wiring layer 20 includes, for example, a light-shielding film 22 disposed on an entire surface thereof (it is to be noted that wiring may not be light-shielded). Moreover, the wiring layer 20 is a multilayer wiring layer, and wiring is installed in entire upper and lower layers of the wiring layer 20. A wiring pattern 23-1 is installed in the upper layer, and a wiring pattern 23-2 is installed in the lower layer. Since the light-shielding film 22 is included, the entry of reflected light or the like is able to be blocked.

When X-ray responsive light enters the light-receiving surface p of the photodetection section 10a, the photodetector in the photodetection IC 11 converts the X-ray responsive light into a current signal, and the receiver in the photodetection IC 11 converts the current signal into a voltage signal. Then, the voltage signal produced in the photodetection section 10a is transmitted to a subsequent processing section through one or both of the wiring patterns 23-1 and 23-2 of the wiring layer 20.

Figure 9:
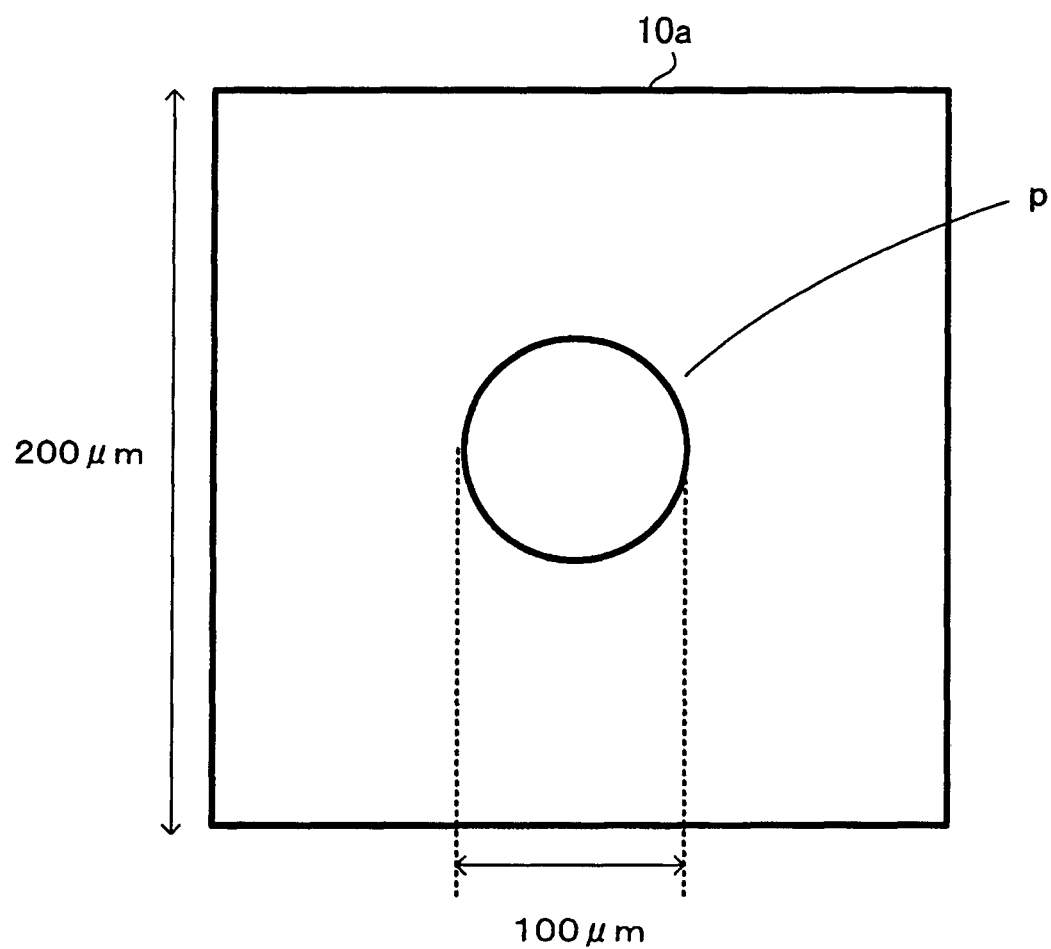
FIG. 9 is a top view of the photodetection section.

FIG. 9 is a top view of the photodetection section 10a. The photodetection section 10a is, for example, a tiny square chip with about 200 μm or less per side. Moreover, the light-receiving surface p has, for example, a circular shape with a diameter of about 100 μm or less.

Figure 10:
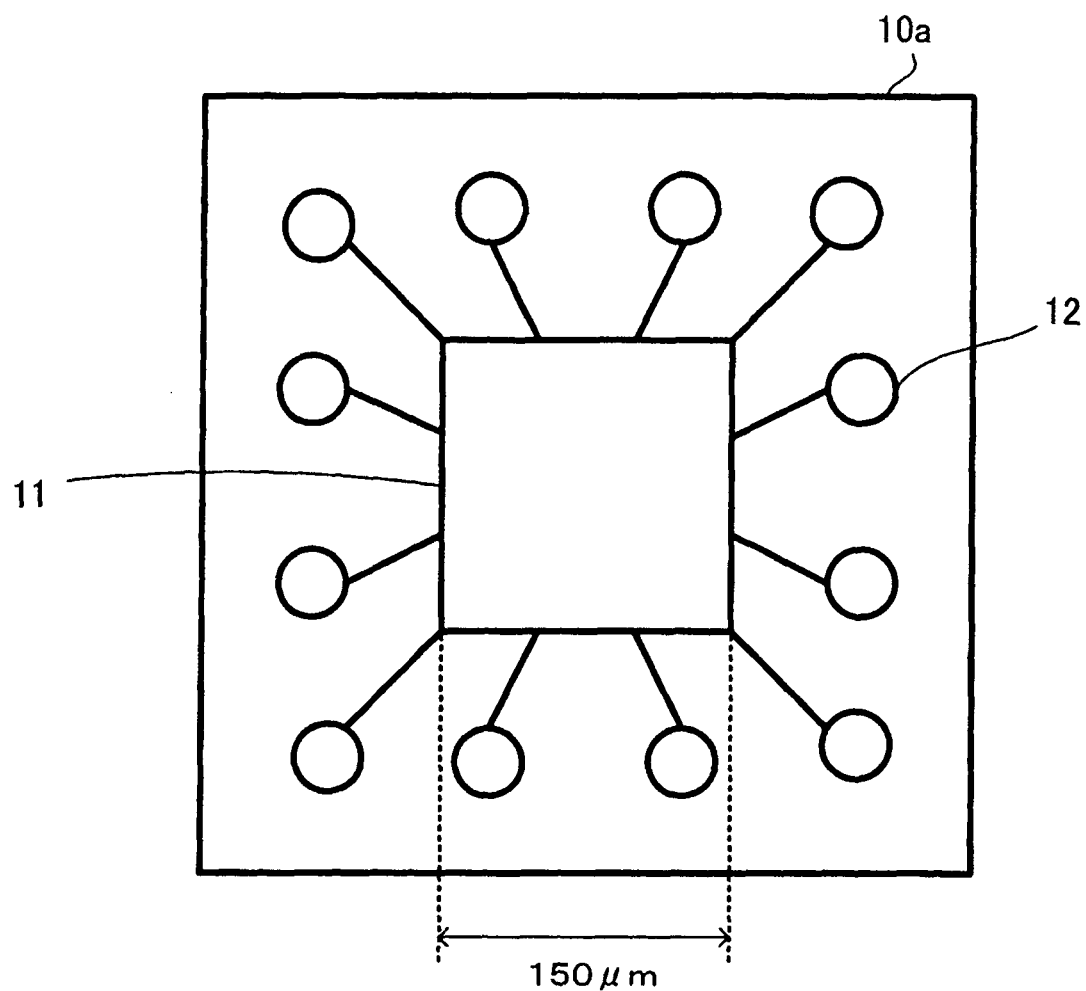
FIG. 10 is a back view of the photodetection section.

FIG. 10 is a back view of the photodetection section 10a. For example, twelve solder bumps 12 are formed on a back surface of the photodetection section 10a. Each of the solder bumps 12 has, for example, a diameter of about 15 μm or less. Moreover, the photodetection IC 11 is a tiny square chip with about 150 μm or less per side. It is to be noted that the thickness of the photodetection section 10a (except for the solder bumps 12) is, for example, about 60 μm or less. It is to be noted that the above-described numerical values are examples only.

Figure 11:
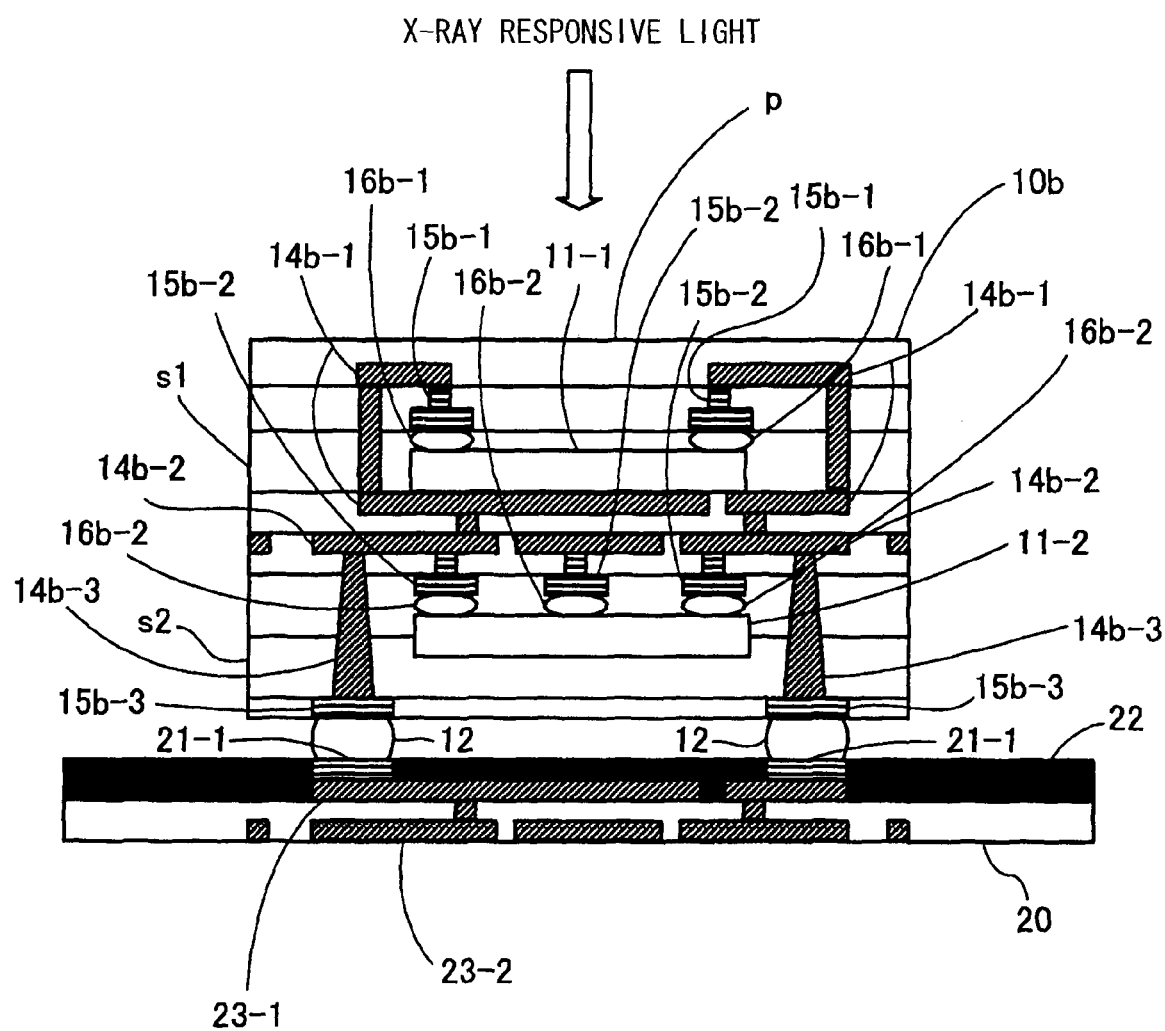
FIG. 11 is a diagram illustrating a state where the photodetection section for one pixel is mounted on the wiring layer.

Next, a modification of the photodetection section will be described below. FIG. 11 is a diagram illustrating a state where the photodetection section for one pixel is mounted on the wiring layer. A photodetection section 10b is a tiny photodetector chip molded of a resin for each pixel, and the solder bumps 12 are formed on a mounting surface where the wiring layer 20 is mounted of the photodetection section 10b. Moreover, although not illustrated, a light-shielding film is formed on an appropriate section other than a photodetection section of the photodetector to prevent an IC from being irradiated with X-ray responsive light.

Moreover, the photodetection section 10b as a modification has a two-layer configuration. The photodetector 11-1 is disposed in a first layer s1 located on a top surface side where light enters of the photodetection section, and the receiver 11-2 is disposed in a second layer s2 below the first layer s1.

Further, in addition to the photodetector 11-1 and the receiver 11-2, wiring patterns 14b-1 and 14b-2, via holes 14b-3, UBMs 15b-1 to 15b-3, and solder bumps 16b-1 and 16b-2 are mounted in the photodetection section 10b.

The photodetector 11-1 is soldered with use of the solder bumps 16b-1, and is connected to the wiring pattern 14b-1 through the solder bumps 16b-1 and the UBMs 15b-1.

Moreover, the receiver 11-2 is soldered with use of the solder bumps 16b-2, and is connected to the wiring pattern 14b-2 through the solder bumps 16b-2 and the UBMs 15b-2.

The wiring pattern 14b-1 and the wiring pattern 14b-2 are connected to each other, and the wiring pattern 14b-2 is further connected to one end of each of the via holes 14b-3. The other end of each of the via holes 14b-3 is connected to each of the UBMs 15b-3. It is to be noted that the via holes 14b-3 are filled with a conductive metal by, for example, via fill plating.

Then, the photodetection section 10b is FC bonded on UBMs 21-1 mounted on the wiring layer 20 through the solder bumps 12.

The wiring layer 20 includes the UBMs 21-1 disposed at soldering positions, and the wiring layer 20 includes, for example, the light-shielding film 22 disposed on an entire surface thereof. Moreover, wiring is installed in entire upper and lower layers of the wiring layer 20. The wiring pattern 23-1 is installed on the upper layer, and the wiring pattern 23-2 is installed on the lower layer.

When X-ray responsive light enters the light-receiving surface p of the photodetection section 10b, the photodetector 11-1 converts the X-ray responsive light into a current signal, and the receiver 11-2 converts the current signal into a voltage signal. Then, the voltage signal produced in the photodetection section 10b is transmitted to a subsequent processing section through one or both of the wiring patterns 23-1 and 23-2 of the wiring layer 20.

Thus, as described above, the photodetection section 10b has a two-layer configuration in which the photodetector 11-1 is disposed in the first layer s1 where light enters and the receiver 11-2 is disposed in the second layer s2 below the first layer s1, and the photodetector 11-1 and the receiver 11-2 are integrally molded.

Accordingly, the photodetector 11-1 is disposed only in the first layer s1 where light enters; therefore, a light-receiving area on one chip is able to be increased, and photodetection efficiency is improvable.

Moreover, the two-layer configuration allows the pitch of each photodetection section to be reduced; therefore, the number of photodetection sections mountable on a single panel area is able to be increased, and resolution as the image pickup panel is improvable.

Figure 12:
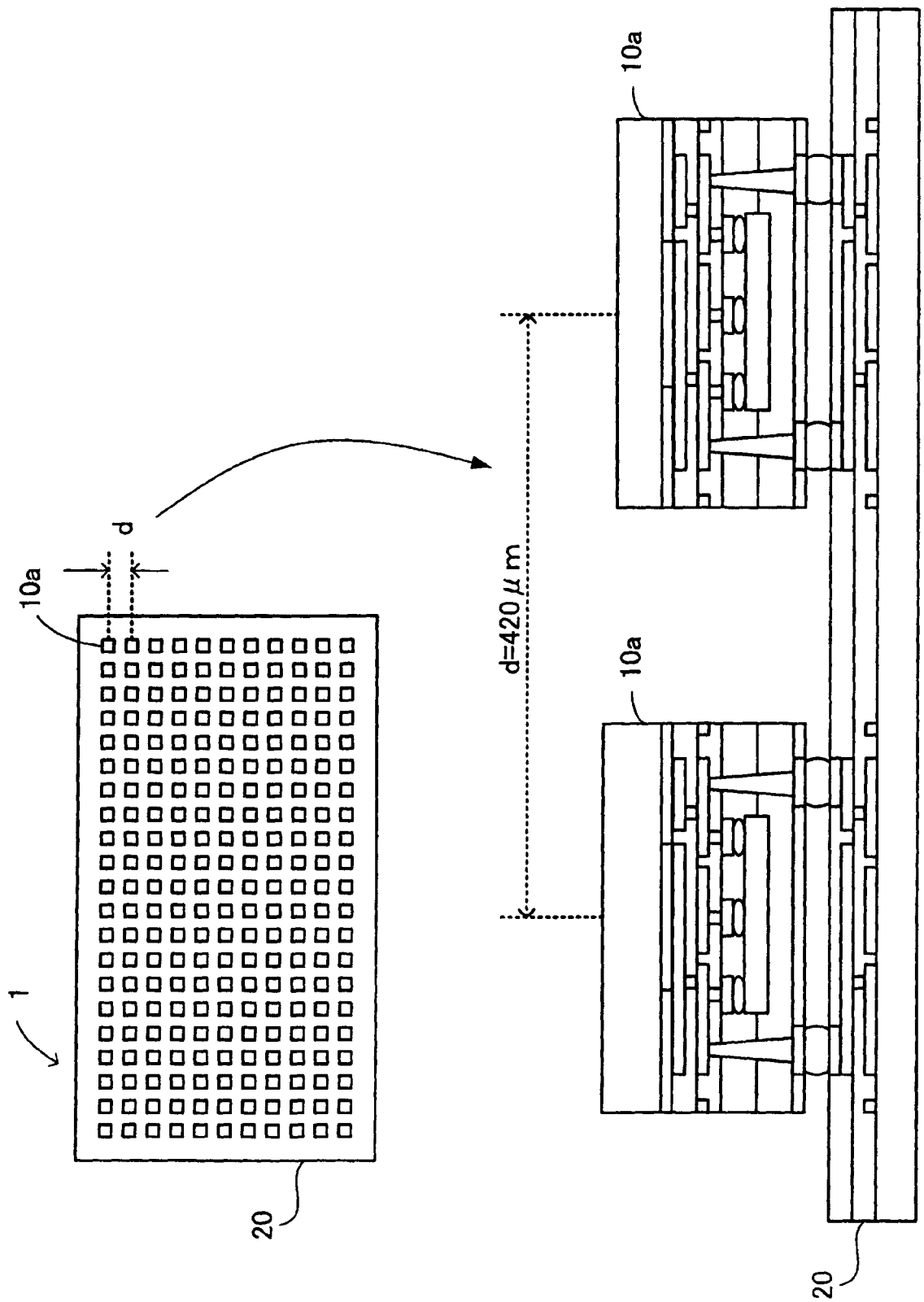
FIG. 12 is a diagram illustrating a mounting pitch of the photodetection section.

It is to be noted that FIG. 12 illustrates a mounting pitch of the photodetection section 10a. For example, a mounting pitch d when the photodetection sections 10a are FC bonded on the wiring layer 20 is about 420 μm or less.

Figure 13:
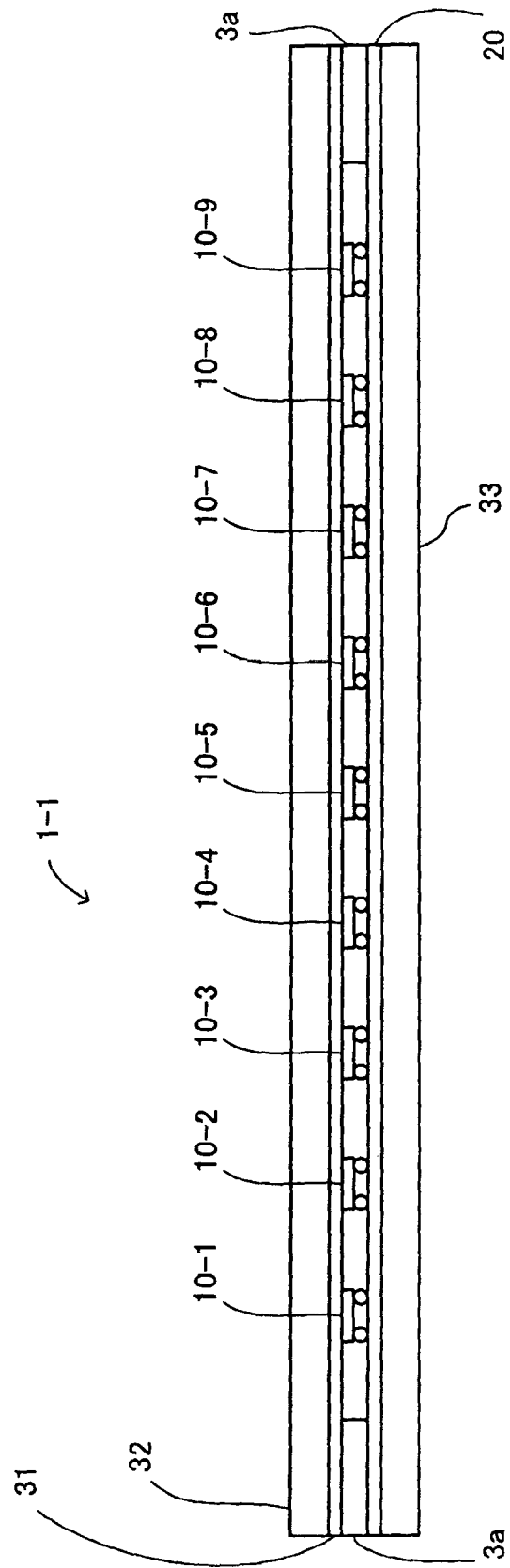
FIG. 13 is a diagram illustrating a configuration example of the image pickup panel.

Next, a configuration of the image pickup panel 1 will be described below. FIG. 13 is a diagram illustrating a configuration example of the image pickup panel. An image pickup panel 1-1 according to a first embodiment includes a plurality of photodetection sections 10 (photodetection sections 10-1 to 10-9 in the drawing) and the wiring layer 20, and further includes a scintillator 31, a cover glass substrate 32, and a wiring-side glass substrate 33.

The photodetection sections 10-1 to 10-9 are FC bonded on the wiring layer 20. Moreover, the scintillator 31 is so disposed as to cover all of light-receiving surfaces of the photodetection sections 10 arranged on the wiring layer 20. It is to be noted that the scintillator 31 is a fluorescent medium converting incident radiation rays (for example, X-rays) into light to emit the light.

The cover glass substrate 32 is disposed on a top surface of the scintillator 31, and covers and protects the scintillator 31. Moreover, the wiring-side glass substrate 33 where the wiring layer 20 is mounted is disposed below the wiring layer 20.

Moreover, while space, where the photodetection sections 10-1 to 10-9 are arranged, between the scintillator 31 and the wiring layer 20 is maintained under slightly negative pressure, the space between the scintillator 31 and the wiring layer 20 is sealed with use of a sealing wall 3a made of a resin or the like. It is to be noted that the cover glass substrate 32 and the wiring-side glass substrate 33 both have, for example, a thickness of about 0.7 mm.

As described above, the image pickup panel 1-1 has a configuration in which the scintillator 31 covering all of the light-receiving surfaces of the photodetection sections 10, the cover glass substrate 32 covering the scintillator 31, and the wiring-side glass substrate 33 disposed below the wiring layer 20 are included and the space, where the photodetection sections 10 are arranged, between the scintillator 31 and the wiring layer 20 is sealed. It is to be noted that in the above-described configuration, a scintillator film is formed on an entire back surface of cover glass; however, the scintillator film may be formed only on a top surface of each photodetection section. Alternatively, the scintillator film may be formed by potting to cover the entire photodetection sections.

The image pickup panel in related art is manufactured through forming the TFT array on the glass substrate, and then forming an X-ray conversion film on a circuit of the TFT array by high-temperature evaporation in a vacuum process.

Therefore, an influence of a base and restrictions on film formation temperature and the like are large. Accordingly, it is difficult to form a desired crystalline film with a certain size of area without causing a crystal defect, and panel repair is restricted; therefore, a larger-scale expensive manufacturing apparatus is necessary.

On the other hand, the image pickup panel 1-1 is manufactured by a method completely different from a method of manufacturing the image pickup panel in related art, and the image pickup panel 1-1 is manufactured through arranging, for respective pixels, the chips of the photodetection sections 10 each including the photodetector 11-1 and the receiver 11-2 which are integrally molded and having the solder bumps 12 formed thereon, and FC bonding the chips of the photodetection sections 10 on the wiring layer 20 with use of the solder bumps 12.

Unlike related art, the image pickup panel is not manufactured by film evaporation; therefore, the area of image pickup panel is easily increased. Moreover, since the image pickup panel is manufactured by FC bonding, a large-scale expensive manufacturing apparatus is not necessary, and the image pickup panel with a large area is able to be manufactured (mass-produced) at low cost.

Moreover, in both the direct conversion and indirect conversion image pickup panels in related art, a signal propagates in the carrier form from the X-ray conversion section until reaching the TFT array, and the wiring capacity of the TFT is large; therefore, noise is easily generated, and a S/N ratio is pronouncedly degraded.

On the other hand, in the image pickup panel 1-1, after X-rays are converted into light, the light is converted into a current signal, and then is I/V-converted into a voltage signal, and the voltage signal is transmitted to the wiring layer 20. Thus, instead of carrier propagation, voltage propagation is performed, and the TFT is not necessary; therefore, the influence of noise which is an issue in related art is able to be remarkably reduced to improve the S/N ratio.

Figure 14:
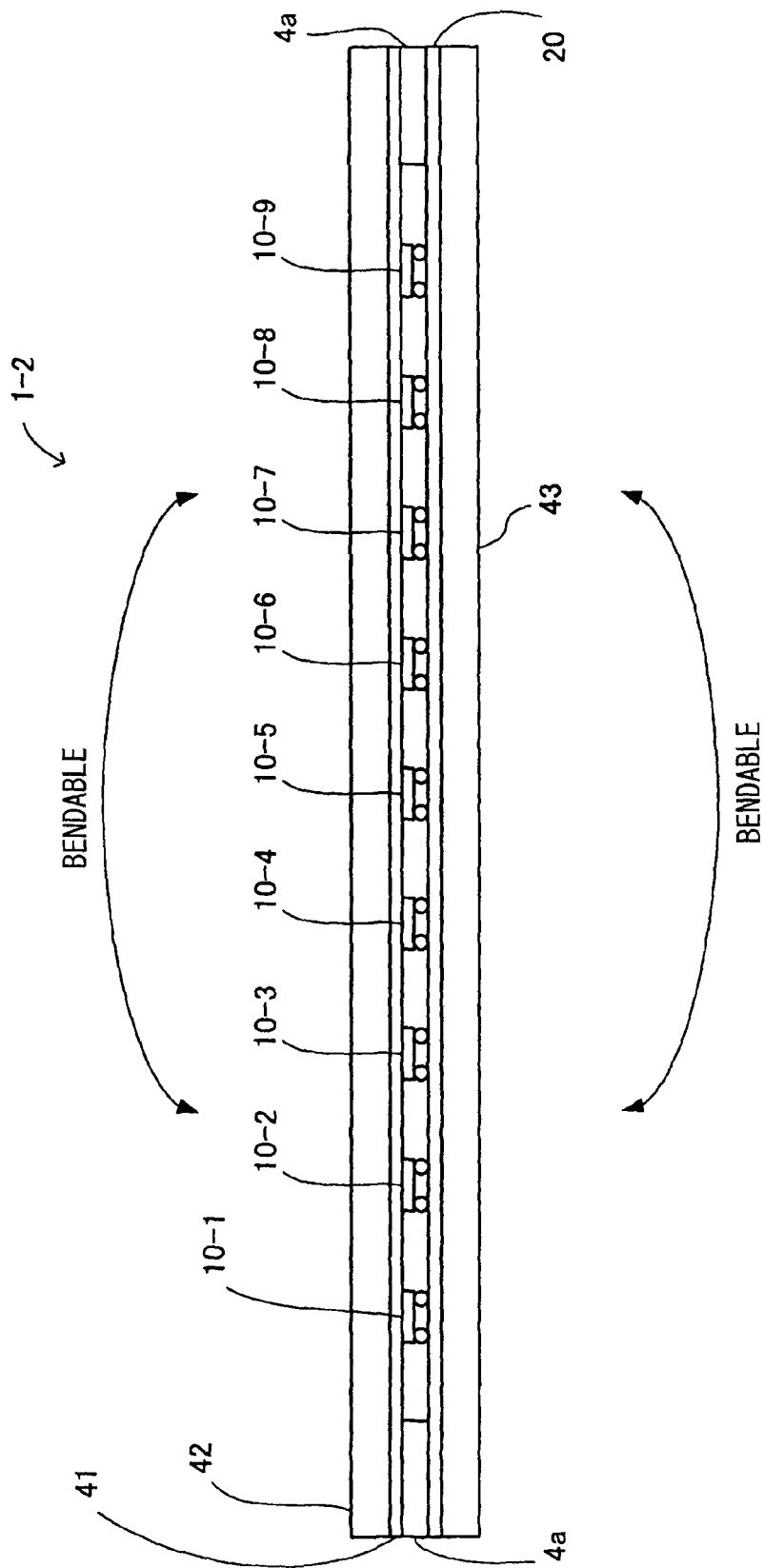
FIG. 14 is a diagram illustrating a configuration example of the image pickup panel.

FIG. 14 is a diagram illustrating a configuration example of the image pickup panel. An image pickup panel 1-2 according to a second embodiment includes a plurality of photodetection sections 10 (the photodetection sections 10-1 to 10-9 in the drawing) and the wiring layer 20, and further includes a scintillator 41, a PET (Polyethylene Terephthalate) substrate 42, and a heat-resistant resin substrate 43.

It is to be noted that the PET substrate 42 and the heat-resistant resin substrate 43 both have flexibility, and the PET substrate 42 corresponds to a first flexible substrate, and the heat-resistant resin substrate 43 corresponds to a second flexible substrate.

The photodetection sections 10-1 to 10-9 are FC bonded on the wiring layer 20. Moreover, the scintillator 41 is so disposed as to cover all of the light-receiving surfaces of the photodetection sections 10 arranged on the wiring layer 20.

The PET substrate 42 is disposed on a top surface of the scintillator 41, and covers and protects the scintillator 41. Moreover, the heat-resistant resin substrate 43 where the wiring layer 20 is mounted is disposed below the wiring layer 20.

Moreover, while space, where the photodetection sections 10-1 to 10-9 are arranged, between the scintillator 41 and the wiring layer 20 is maintained under slightly negative pressure, the space between the scintillator 41 and the wiring layer 20 is sealed with use of a sealing wall 4a made of a resin or the like.

It is to be noted that the PET substrate 42 has, for example, a thickness of about 1.0 mm, and the heat-resistant resin substrate 43 has, for example, a thickness of about 0.5 mm.

As described above, the image pickup panel 1-2 has a configuration in which the scintillator 41 covering all of the light-receiving surfaces of the photodetection sections 10, the PET substrate 42 covering the scintillator 41, and the heat-resistant resin substrate 43 disposed below the wiring layer 20 are included and the space, where the photodetection sections 10 are arranged, between the scintillator 41 and the wiring layer 20 is sealed.

Therefore, as in the first embodiment, unlike related art, the image pickup panel is not manufactured by film evaporation; therefore, the area of image pickup panel is easily increased. Moreover, since the image pickup panel is manufactured by FC bonding, a large-scale expensive manufacturing apparatus is not necessary, and the image pickup panel with a large area is able to be manufactured at low cost.

Moreover, as in the above-described case, in the image pickup panel 1-2, signal propagation in the carrier form is not performed, and the TFT is not necessary; therefore, the influence of noise which is an issue in related art is able to be remarkably reduced.

Further, the image pickup panel 1-2 has a configuration in which the photodetection sections 10 arranged on the wiring layer 20 are sandwiched between the PET substrate 42 and the heat-resistant resin substrate 43 both having flexibility; therefore, the image pickup panel 1-2 itself is bendable.

In this case, X-rays are typically emitted from a point light source of an X-ray generator. Moreover, since the image pickup panel in related art is manufactured by high-temperature evaporation, a flat glass plate (which is not bendable) is used.

The image pickup panel in related art is not bendable and is flat. Therefore, X-ray travel distance from the X-ray point light source to an irradiation surface of the image pickup panel is increased with increasing distance from a central position, which is irradiated with X-rays at the shortest distance from the X-ray point light source, of the irradiation surface to a position irradiated with X-rays of the irradiation surface.

Therefore, when an image with a large area is picked up, accurate image information is obtained at the central position which is irradiated with X-rays at the shortest distance from the X-ray point light source and its surroundings; however, an image is more blurred with increasing distance from the central position and its surroundings to a position irradiated with X-rays.

Therefore, in the image pickup panel in related art, when an image with a large area is picked up, images are picked up at a plurality of different positions, and joints of a plurality of picked-up image screens are connected by image processing to produce one screen.

On the other hand, the image pickup panel 1-2 is bendable. Therefore, the image pickup panel 1-2 is bendable to allow the X-ray travel distances from the X-ray point light source to all positions on an irradiation surface of the image pickup panel 1-2 to be equal.

Even if an image with a large area is picked up, unlike related art, it is not necessary to perform an operation of picking up images at a plurality of positions and connecting a plurality of picked-up image screens to one another, and accurate image information is obtainable by one image pickup operation.

Figure 15:
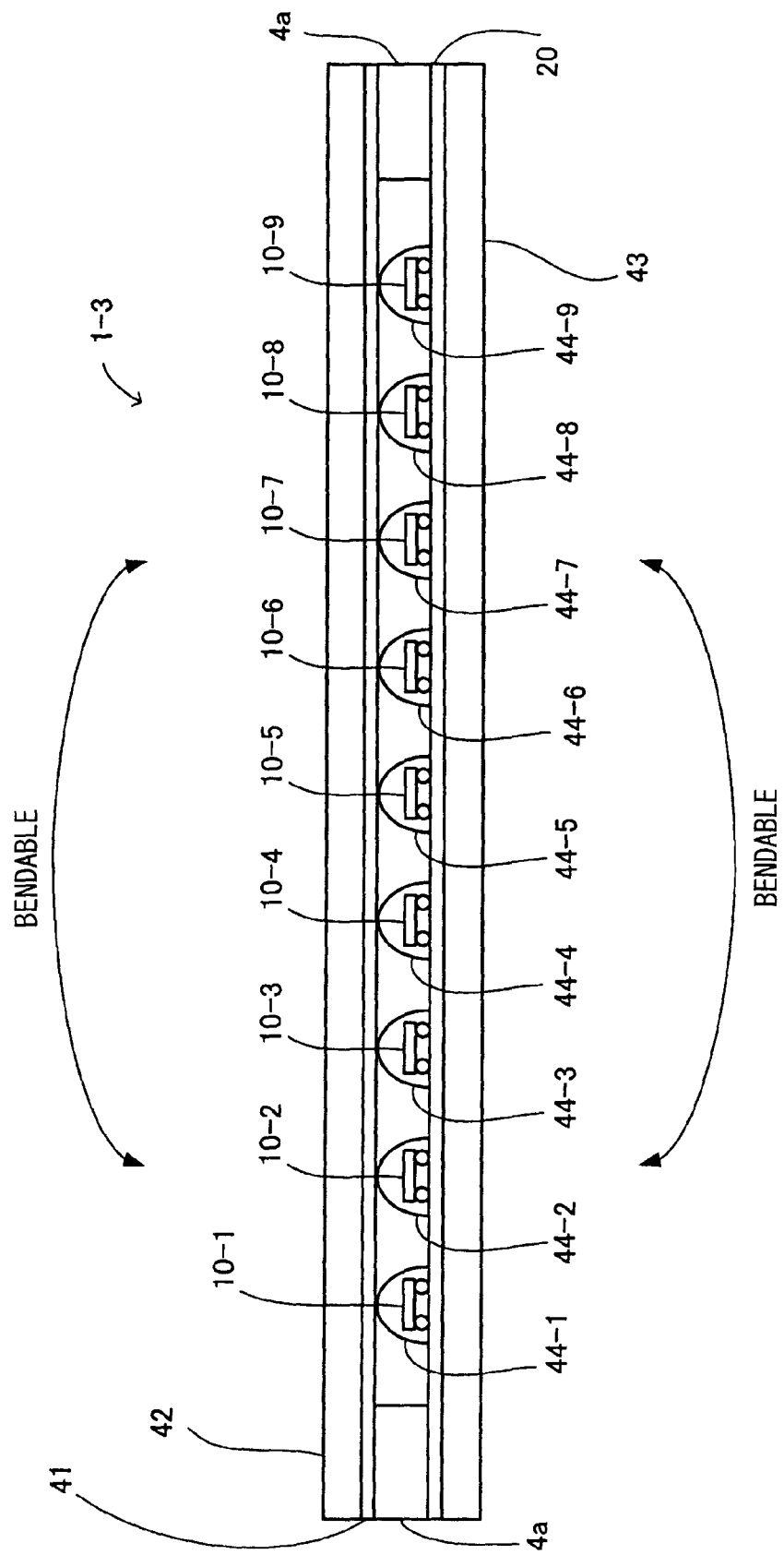
FIG. 15 is a diagram illustrating a configuration example of the image pickup panel.

FIG. 15 is a diagram illustrating a configuration example of the image pickup panel. An image pickup panel 1-3 according to a third embodiment includes a plurality of photodetection sections 10 (the photodetection sections 10-1 to 10-9 in the drawing) and the wiring layer 20, and further includes the scintillator 41, the PET substrate 42, and the heat-resistant resin substrate 43.

The image pickup panel 1-3 has the same basic configuration as the image pickup panel 1-2 according to the second embodiment. The image pickup panel 1-3 is different from the image pickup panel 1-2 in that, after the photodetection sections 10-1 to 10-9 are FC bonded on the wiring layer 20, transparent resins 44-1 to 44-9 are formed on the photodetection sections 10-1 to 10-9 by a potting process (a resin potting process) with use of, for example, a high-speed dispenser to seal the photodetection sections 10-1 to 10-9, respectively.

The transparent resins 44-1 to 44-9 to have a lens effect through potting the photodetection sections 10-1 to 10-9 with the transparent resins 44-1 to 44-9, respectively.

Figure 16:
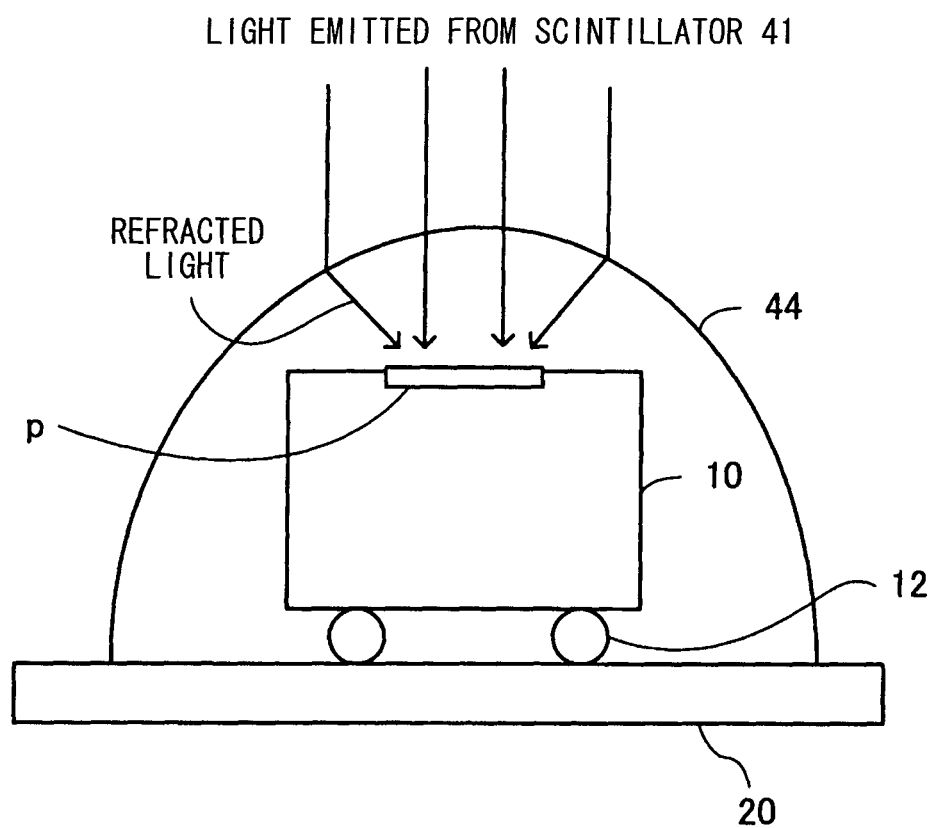
FIG. 16 is a diagram illustrating a lens effect of a transparent resin.

FIG. 16 is a diagram illustrating a lens effect of the transparent resin. The photodetection section 10 is potted with a transparent resin 44. Accordingly, the transparent resin 44 has the lens effect, and light emitted from the scintillator 41 is refracted, and the refracted light is allowed to be focused on the light-receiving surface p of the photodetection section 10.

Thus, in the image pickup panel 1-3, photodetection efficiency is improvable, in addition to effects of the image pickup panel 1-2 according to the second embodiment. Moreover, a surface of the transparent resin or the transparent resin itself may have a function of the scintillator. In this case, X-ray responsive light is less likely to reach surrounding photodetection sections; therefore, resolution is improvable.

Figure 17:
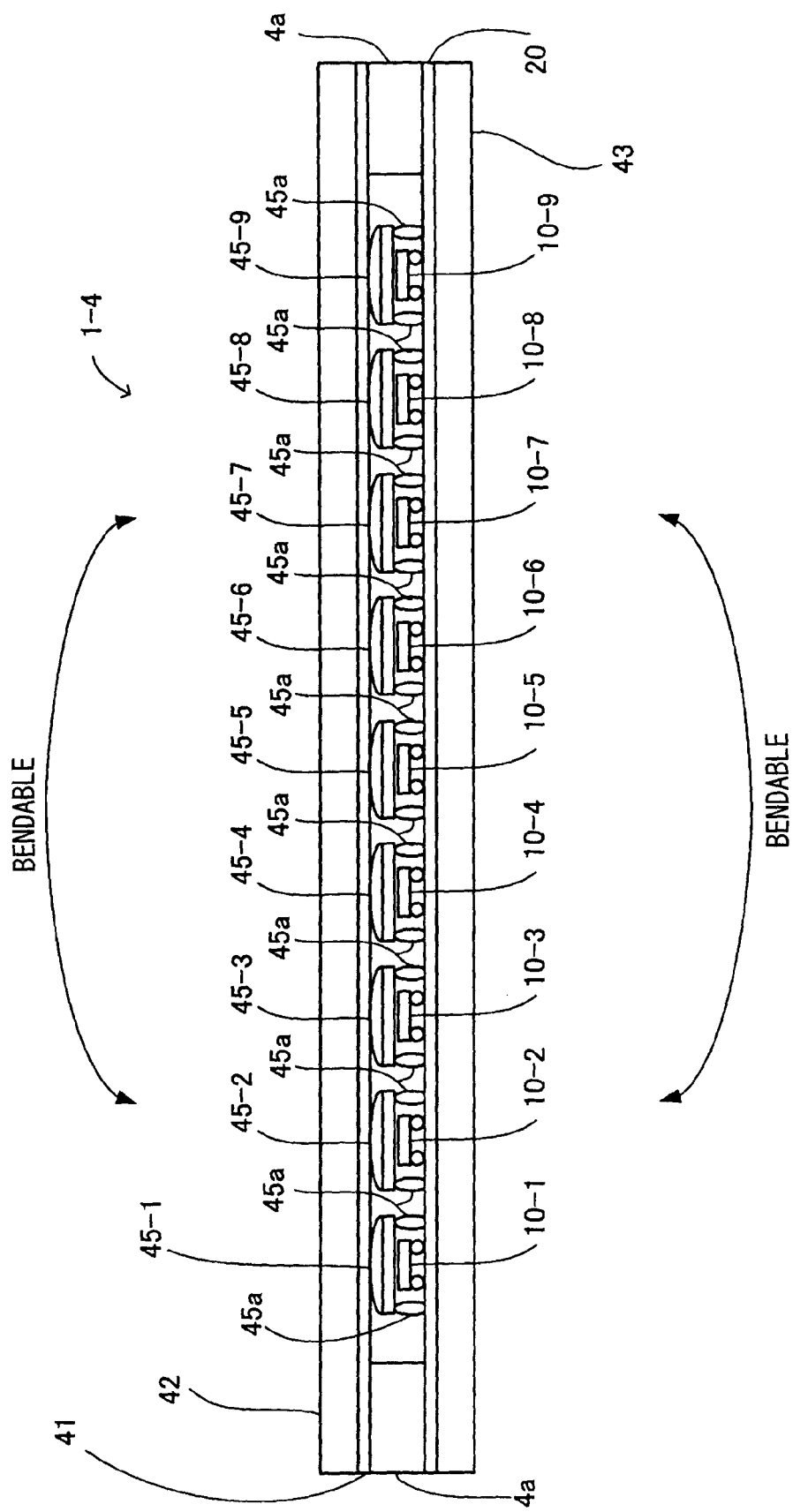
FIG. 17 is a diagram illustrating a configuration example of the image pickup panel.

FIG. 17 is a diagram illustrating a configuration example of the image pickup panel. An image pickup panel 1-4 according to a fourth embodiment includes a plurality of photodetection sections 10 (the photodetection sections 10-1 to 10-9 in the drawing) and the wiring layer 20, and further includes the scintillator 41, the PET substrate 42, and the heat-resistant resin substrate 43.

The image pickup panel 1-4 has the same basic configuration as the image pickup panel 1-2 according to the second embodiment. The image pickup panel 1-4 is different from the image pickup panel 1-2 in that the image pickup panel 1-4 further includes lens sections 45-1 to 45-9 focusing light on light-receiving surfaces of the photodetection sections 10-1 to 10-9, respectively.

The lens sections 45-1 to 45-9 are lens chips each configured through forming a solder bump 45a on a lens made of glass, plastic, or the like, and are so FC bonded on the wiring layer 20 as to cover the photodetection sections 10-1 to 10-9, respectively.

The lens sections 45-1 to 45-9 focus light emitted from the scintillator 41 on the light-receiving surfaces of the photodetection sections 10-1 to 10-9, respectively. Accordingly, in the image pickup panel 1-4, photodetection efficiency is improvable, in addition to the effects of the image pickup panel 1-2 according to the second embodiment.

It is to be noted that, in the above-described configuration, it is important to allow central optical axes of the lens sections 45-1 to 45-9 to be coincident with centers of the light-receiving surfaces of the photodetection sections 10-1 to 10-9, respectively. In this case, the lens sections 45-1 to 45-9 is soldered on the wiring layer 20 with the solder bumps 45a in between; therefore, positions of the lens sections 45-1 to 45-9 are automatically adjusted by a solder self-alignment effect.

It is to be noted that the self-alignment effect is a phenomenon in which a component is automatically moved near, for example, a center of a land by solder surface tension.

Therefore, since the solder self-alignment effect works, only by passing the lens chip through a reflow furnace, the central optical axes of the lens sections 45-1 to 45-9 are allowed to be coincident with the centers of the light-receiving surfaces of the photodetection sections 10-1 to 10-9, respectively, within, for example, a tolerance of about ±1 μm, and positions of the lens sections 45-1 to 45-9 are automatically adjusted.

Figure 18:
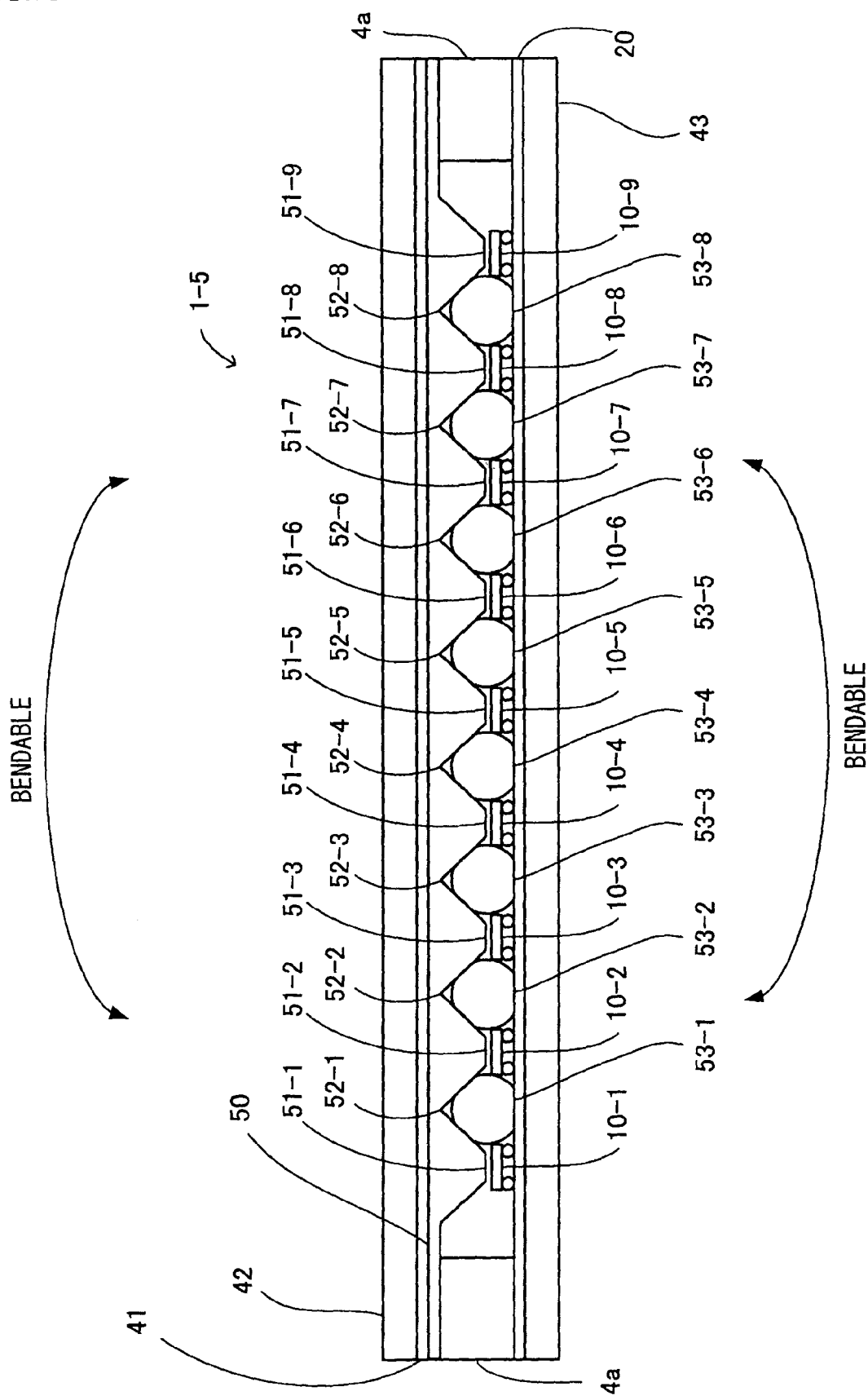
FIG. 18 is a diagram illustrating a configuration example of the image pickup panel.

FIG. 18 is a diagram illustrating a configuration example of the image pickup panel. An image pickup panel 1-5 according to a fifth embodiment includes a plurality of photodetection sections 10 (the photodetection sections 10-1 to 10-9 in the drawing) and the wiring layer 20, and further includes the scintillator 41, PET substrates 42 and 50, and the heat-resistant resin substrate 43.

The photodetection sections 10-1 to 19-9 are FC bonded on the wiring layer 20. Moreover, the scintillator 41 is so disposed as to cover all of the light-receiving surfaces of the photodetection sections 10-1 to 10-9 arranged on the wiring layer 20.

The PET substrate 42 is disposed on a top surface of the scintillator 41, and covers and protects the scintillator 41. Moreover, the PET substrate 50 is disposed on a bottom surface of the scintillator 41.

Figure 19:
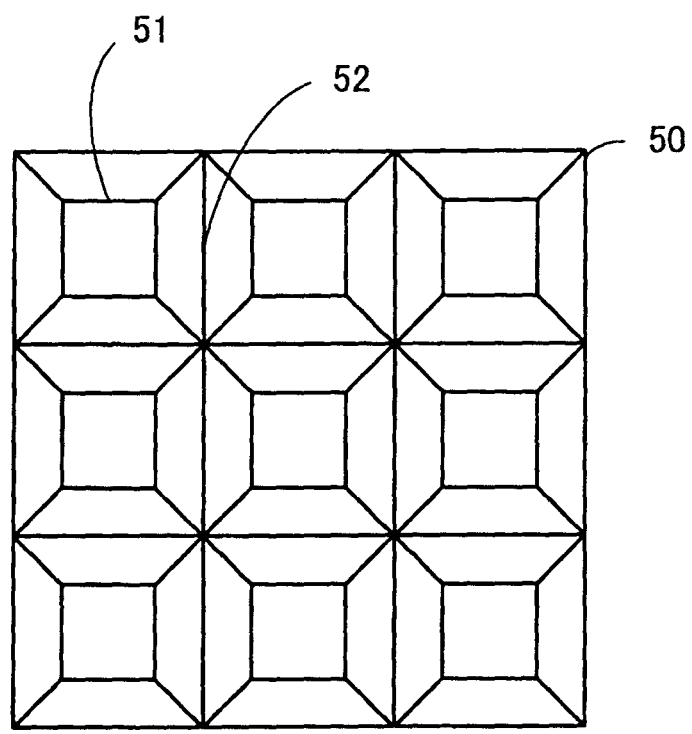
FIG. 19 is a top view illustrating a configuration of a concavo-convex-shaped section of a PET substrate.

The PET substrate 50 has a concavo-convex shape for each of the photodetection sections 10-1 to 10-9 toward the light-receiving surfaces of the photodetection sections 10-1 to 10-9, and protrusions 51-1 to 51-9 are formed in the PET substrate 50. FIG. 19 is a top view illustrating a configuration of a concavo-convex-shaped section of the PET substrate 50. Protrusions 51 and recessions 52 are formed in the PET substrate 50.

In FIG. 18, tips of the protrusions 51-1 to 51-9 are located on the light-receiving surfaces of the photodetection sections 10-1 to 10-9 to totally reflect light emitted from the scintillator 41, and then to focus the totally reflected light on the light-receiving surfaces of the photodetection sections 10-1 to 10-9, respectively.

Moreover, solder bumps 53-1 to 53-8 with a large dimension are formed between recessions (recessions 52-1 to 52-8) formed between any adjacent ones of the protrusions and the wiring layer 20, and the PET substrate 50 is mounted on the wiring layer 20 with the solder bumps 53-1 to 53-8 in between.

It is to be noted that in the above-described configuration, alignment between the tips of the protrusions 51-1 to 51-9 and the light-receiving surfaces of the photodetection sections 10-1 to 10-9 is important. In this case, since the solder bumps 53-1 to 54-8 are formed between the recessions 52-1 to 52-8 and the wiring layer 20, positions of the tips of the protrusions 51-1 to 51-9 are automatically adjusted by a solder self-alignment effect similar to the above-described self-alignment effect.

In other words, since the solder self-alignment effect works, only by passing the lens chip through a reflow furnace, the tips of the protrusions 51-1 to 51-9 are allowed to be coincident with the centers of the light-receiving surfaces of the photodetection sections 10-1 to 10-9, respectively, and positions of the tips of the protrusions 51-1 to 51-9 are automatically adjusted.

Figure 20:
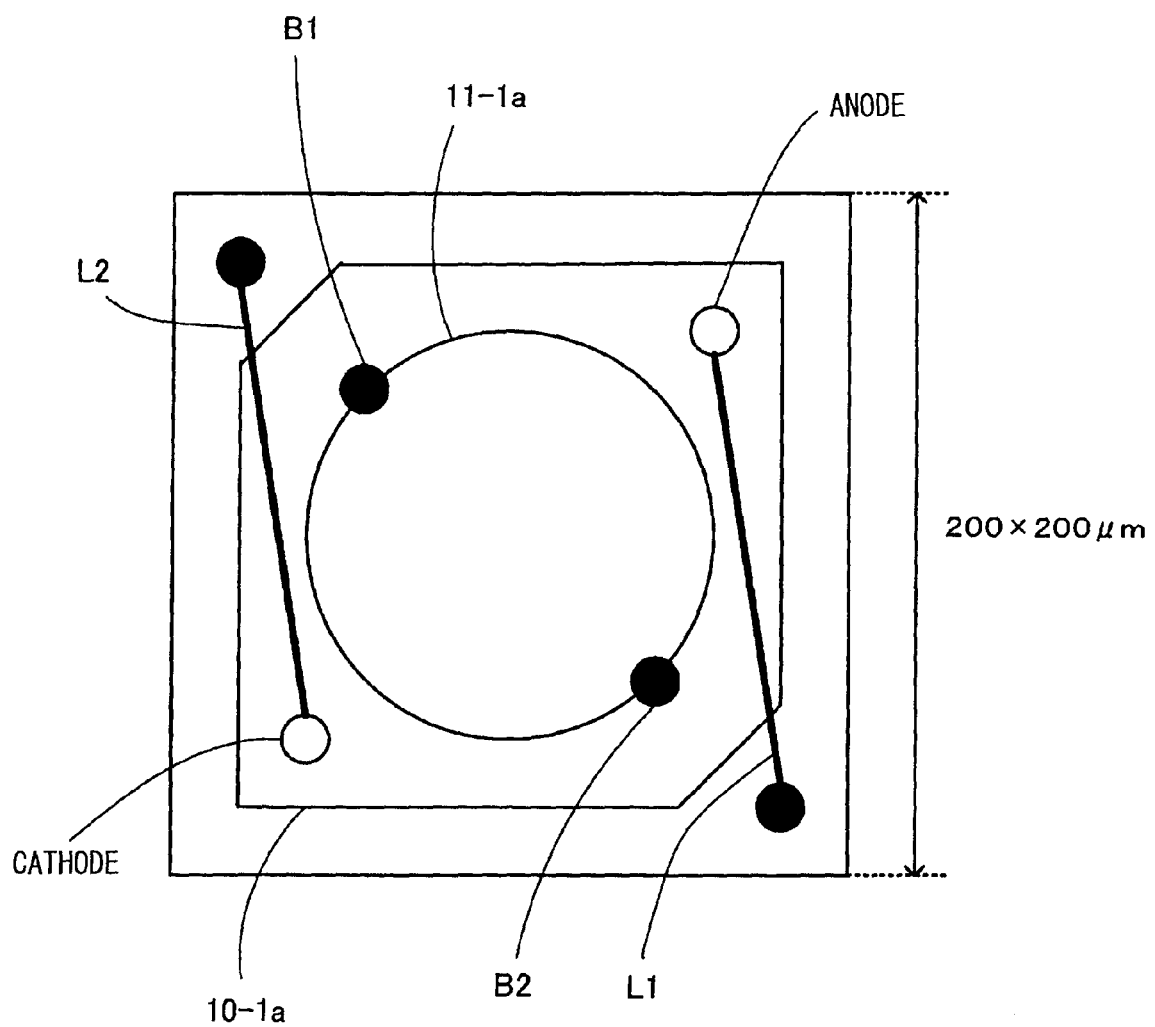
FIG. 20 is a diagram illustrating a light-receiving surface of a photodetector.

Next, a shape of the photodetector will be described below. FIG. 20 is a diagram illustrating a light-receiving surface of the photodetector. A photodetection section 10-1a includes a photodetector 11-1a with a circular light-receiving surface. The photodetection section 10-1a has, for example, a chip size of about 200×200 μm or less, and the light-receiving surface has, for example, a diameter of about 180 μm or less.

An anode and a cathode of the photodetector 11-1a are connected to wiring patterns L1 and L2, respectively. Moreover, dummy bumps B1 and B2 are so provided as to horizontally mount the photodetector 11-1a in manufacturing by transfer. In other words, the photodetector 11-1a is horizontally mounted by four bumps, i.e., bumps formed on the anode and the cathode and the dummy bumps B1 and B2. It is to be noted that it is difficult to maintain flatness by two-point support; therefore, a dummy pattern is provided to secure flatness.

Figure 21:
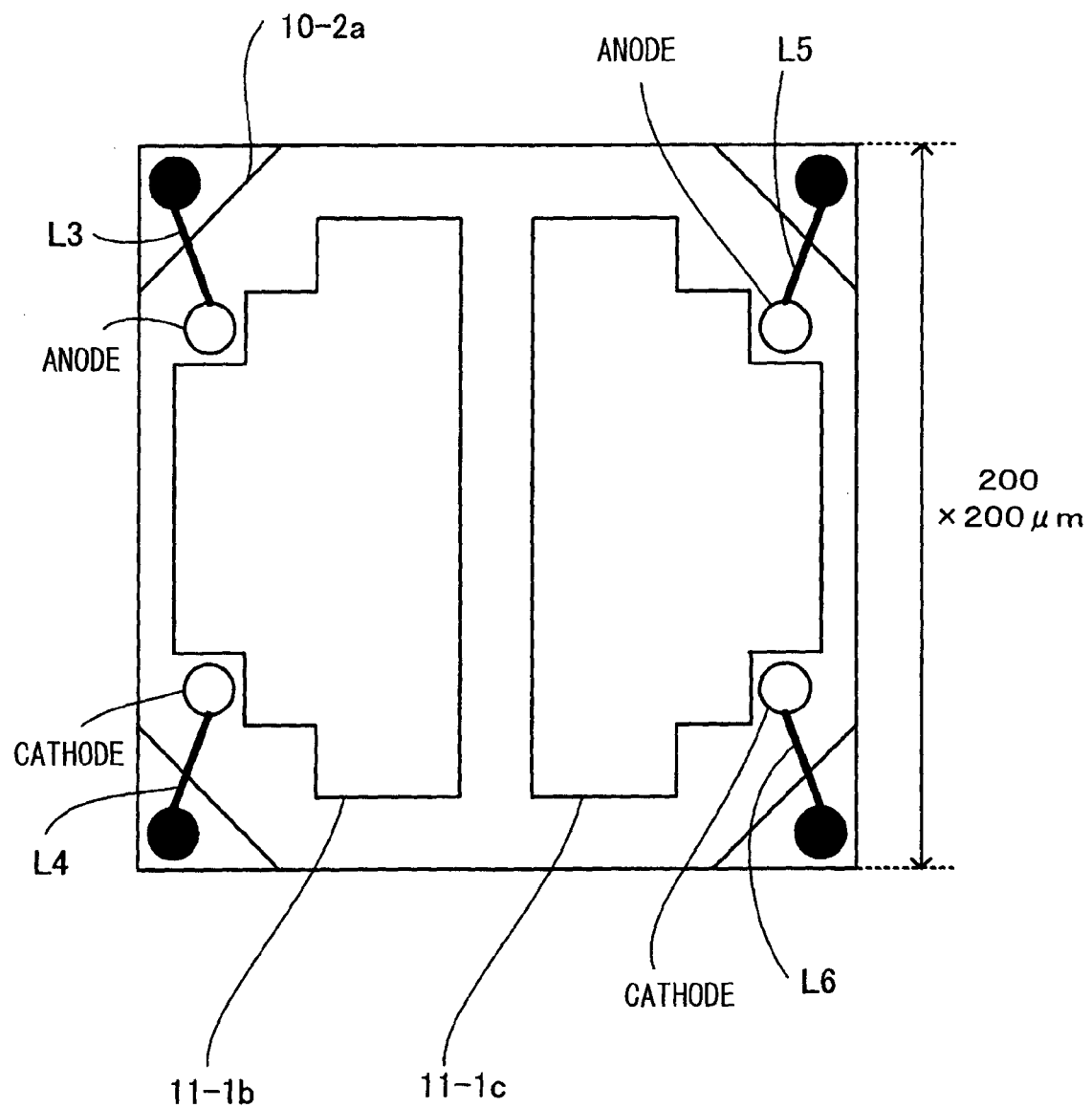
FIG. 21 is a diagram illustrating the light-receiving surface of the photodetector.

FIG. 21 is a diagram illustrating the light-receiving surface of the photodetector. A photodetection section 10-2a has a 2ch configuration including two photodetectors 11-1b and 11-1c. The photodetection section 10-2a has, for example, a chip size of about 200×200 μm or less. An anode and a cathode of the photodetector 11-1b as a first channel are connected to wiring patterns L3 and L4, respectively. Moreover, an anode and cathode of the photodetector 11-1c as a second channel are connected to wiring patterns L5 and L6, respectively. Redundancy is obtainable by the 2ch configuration, and switching from one of two channels to the other (switching to a channel with higher precision) may be performed.

Figure 22:
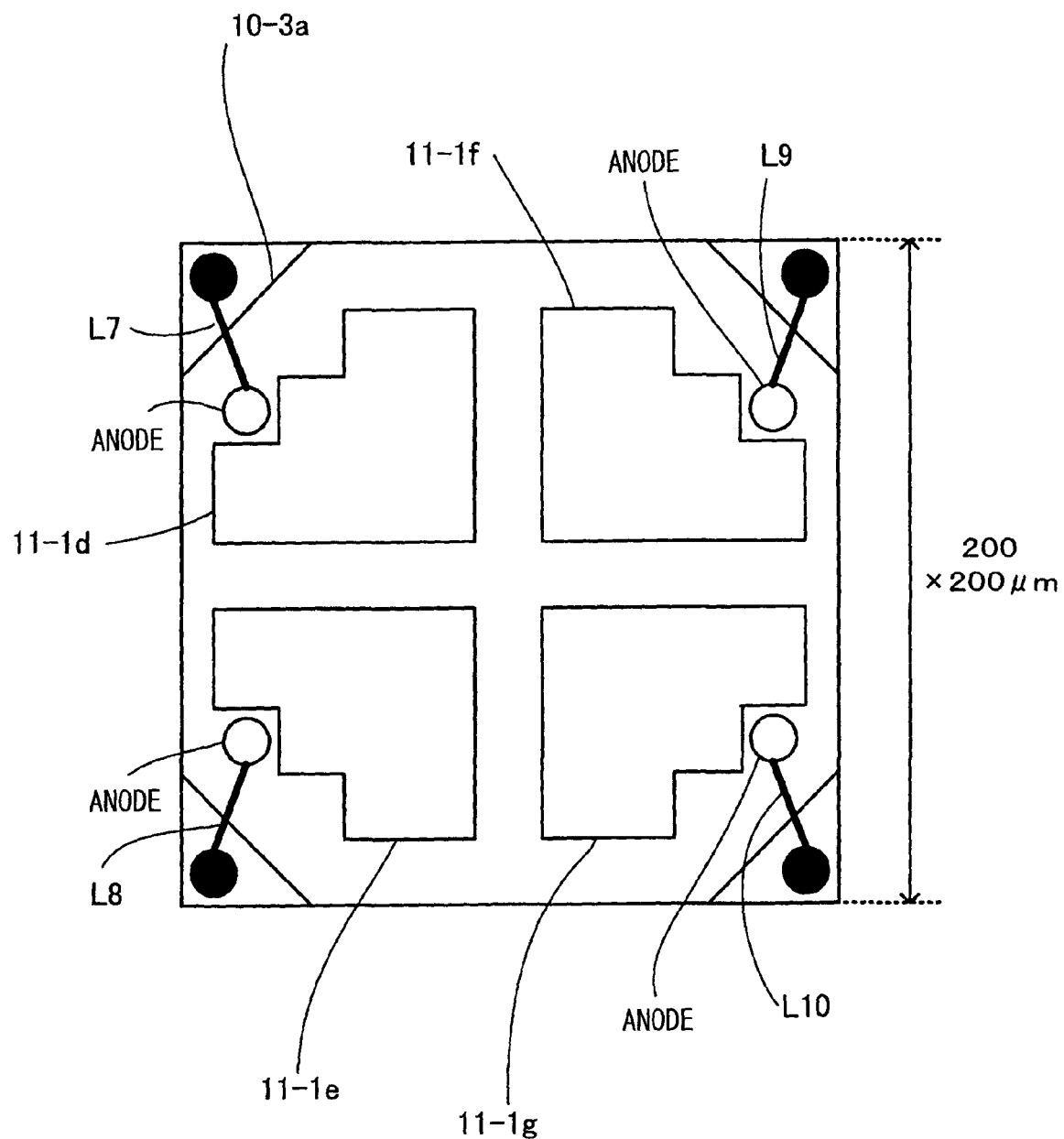
FIG. 22 is a diagram illustrating the light-receiving surface of the photodetector.

FIG. 22 is a diagram illustrating the light-receiving surface of the photodetector. A photodetection section 10-3a has a 4ch configuration including four photodetectors 11-1d, 11-1e, 11-1f, and 11-1g. The photodetection section 10-3a has, for example, a chip size of about 200×200 μm or less. Redundancy is obtainable by the 4ch configuration, and switching from one of four channels to another (switching to a channel with higher precision) may be performed.

An anode of the photodetector 11-1d as a first channel is connected to a wiring pattern L7, and an anode of the photodetector 11-1e as a second channel is connected to a wiring pattern L8. Moreover, an anode of the photodetector 11-1f as a third channel is connected to a wiring pattern L9, and an anode of the photodetector 11-1g as a fourth channel is connected to a wiring pattern L10. Moreover, cathodes of the photodetectors 11-1d, 11-1e, 11-1f, and 11-1g are connected to a wiring pattern by back connection.

It is to be noted that the photodetectors described above in FIGS. 20 to 22 are formed into chips by a dry etching process. Therefore, the chip shape of the photodetector is not limited to the above-described circular and square shapes, and is freely designed.

Figure 23:
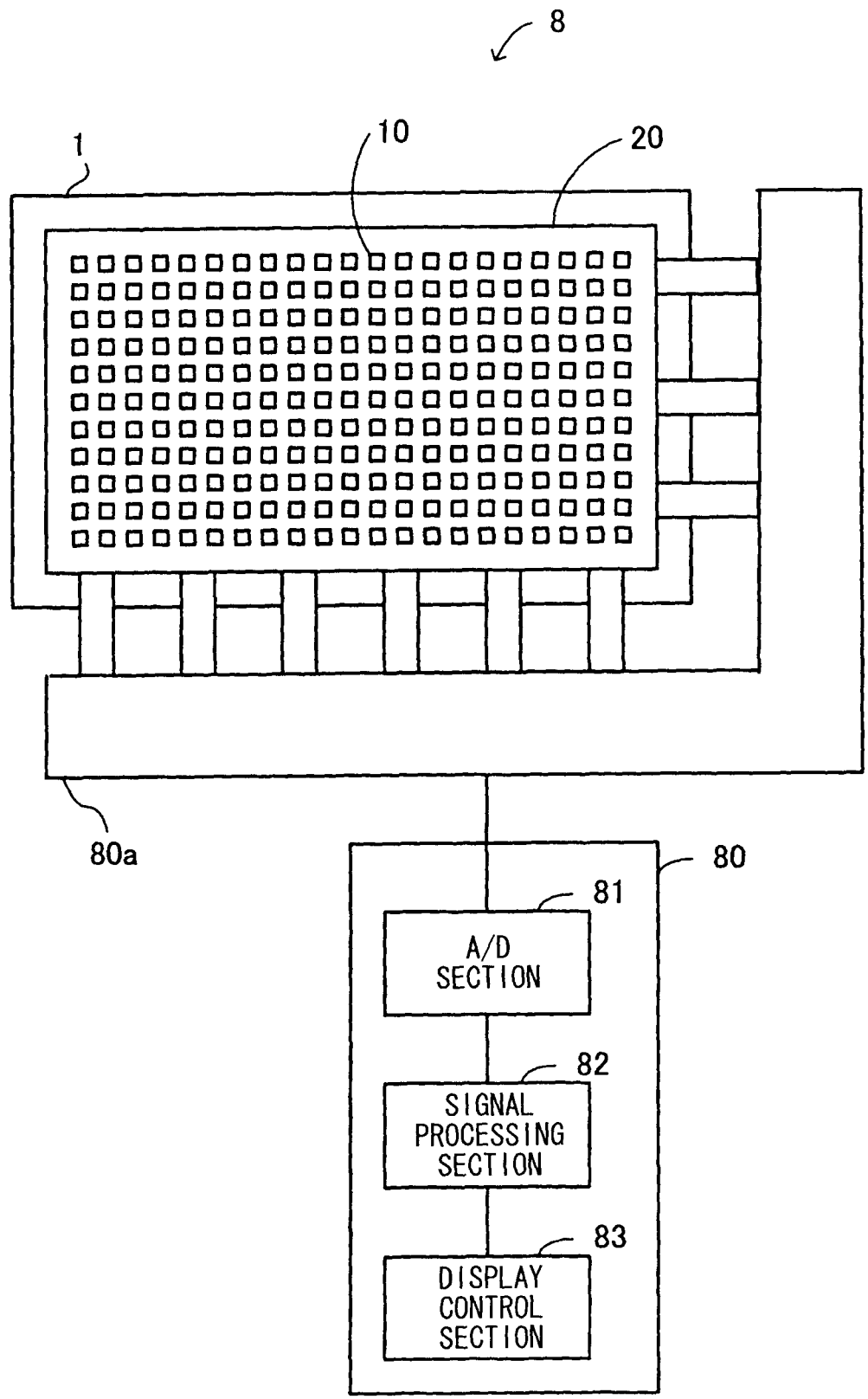
FIG. 23 is a diagram illustrating a configuration example of an image pickup processing system.
Figure 24:
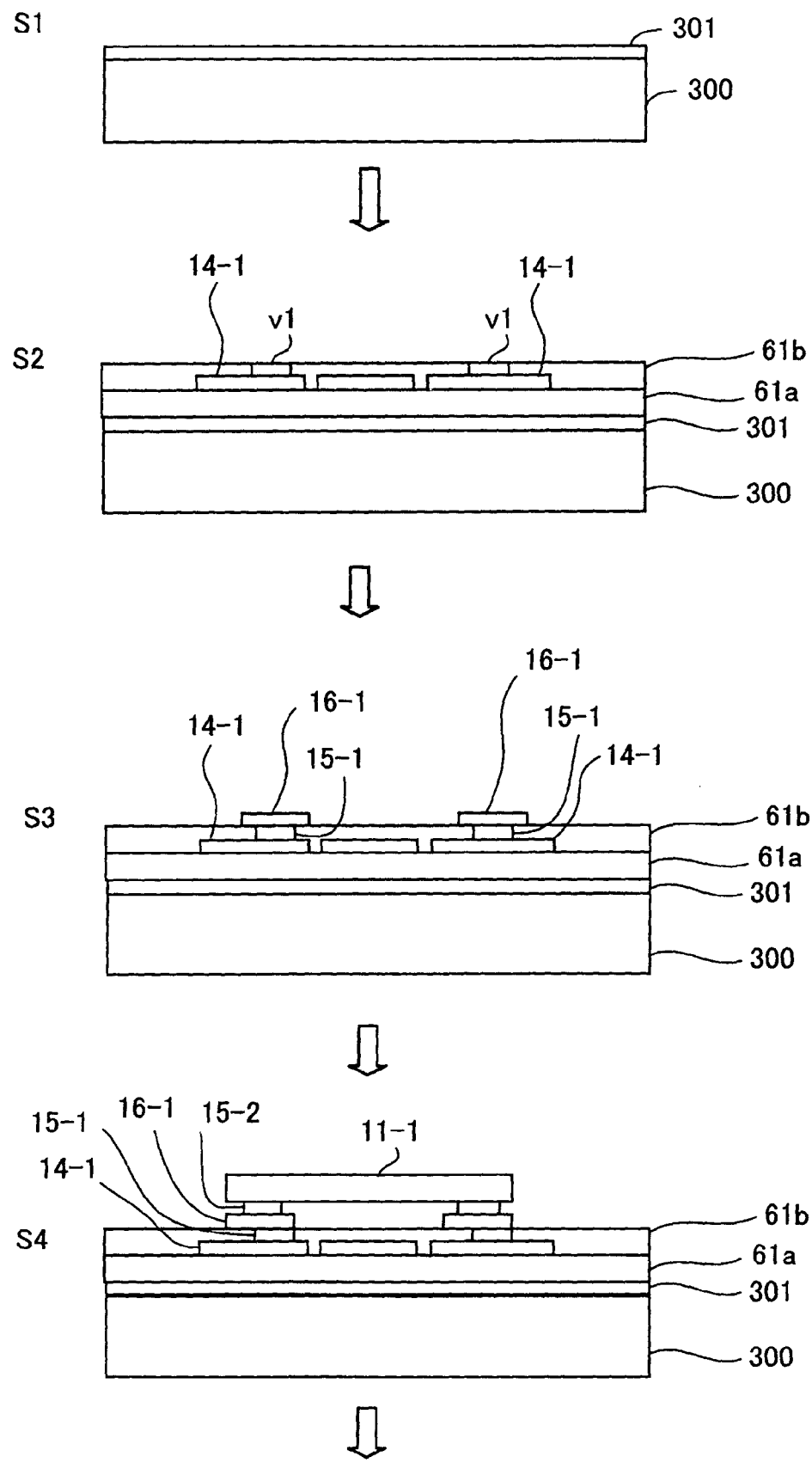
FIG. 24 is a diagram illustrating a flow of manufacturing the image pickup panel.
Figure 25:
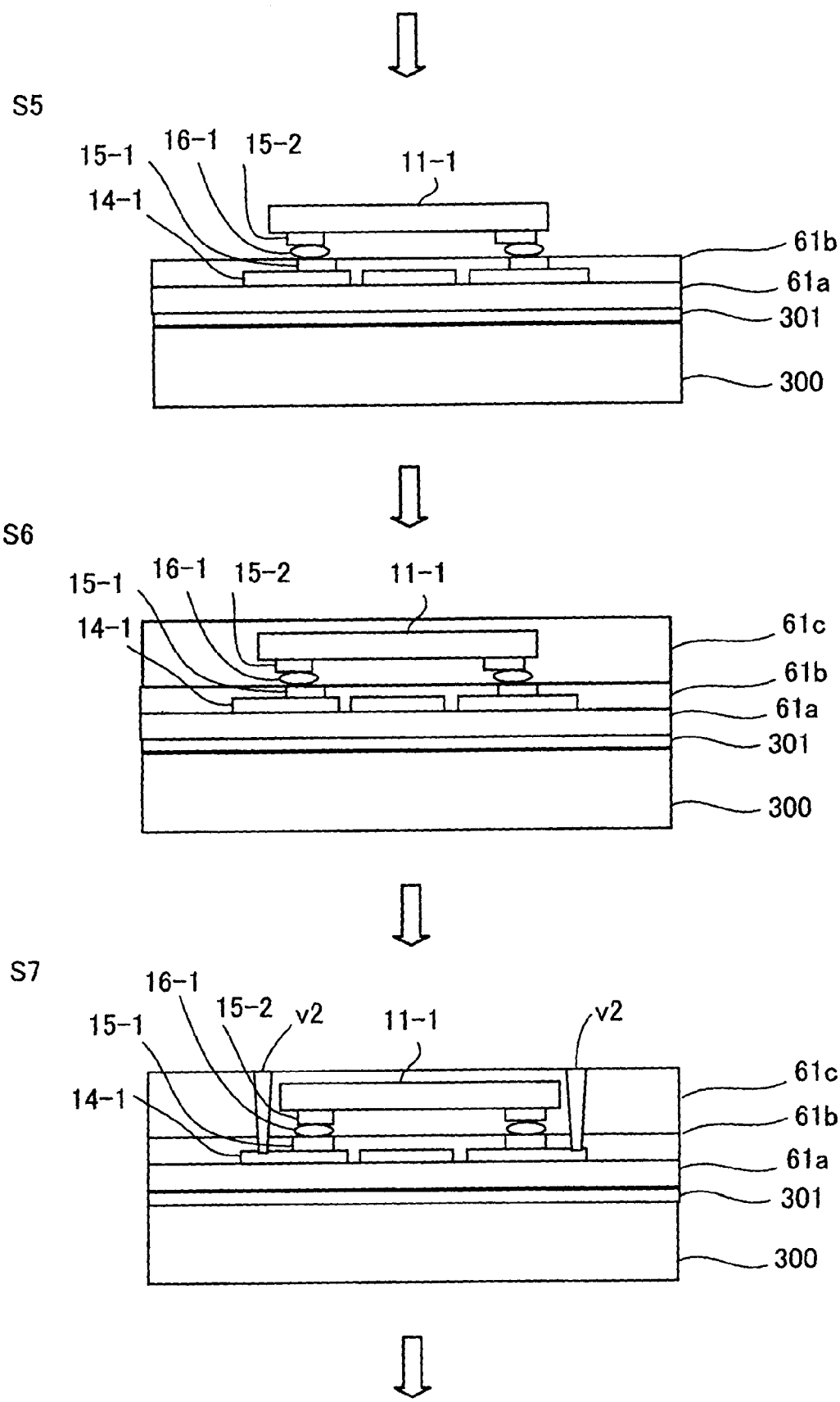
FIG. 25 is a diagram illustrating the flow of manufacturing the image pickup panel.
Figure 26:
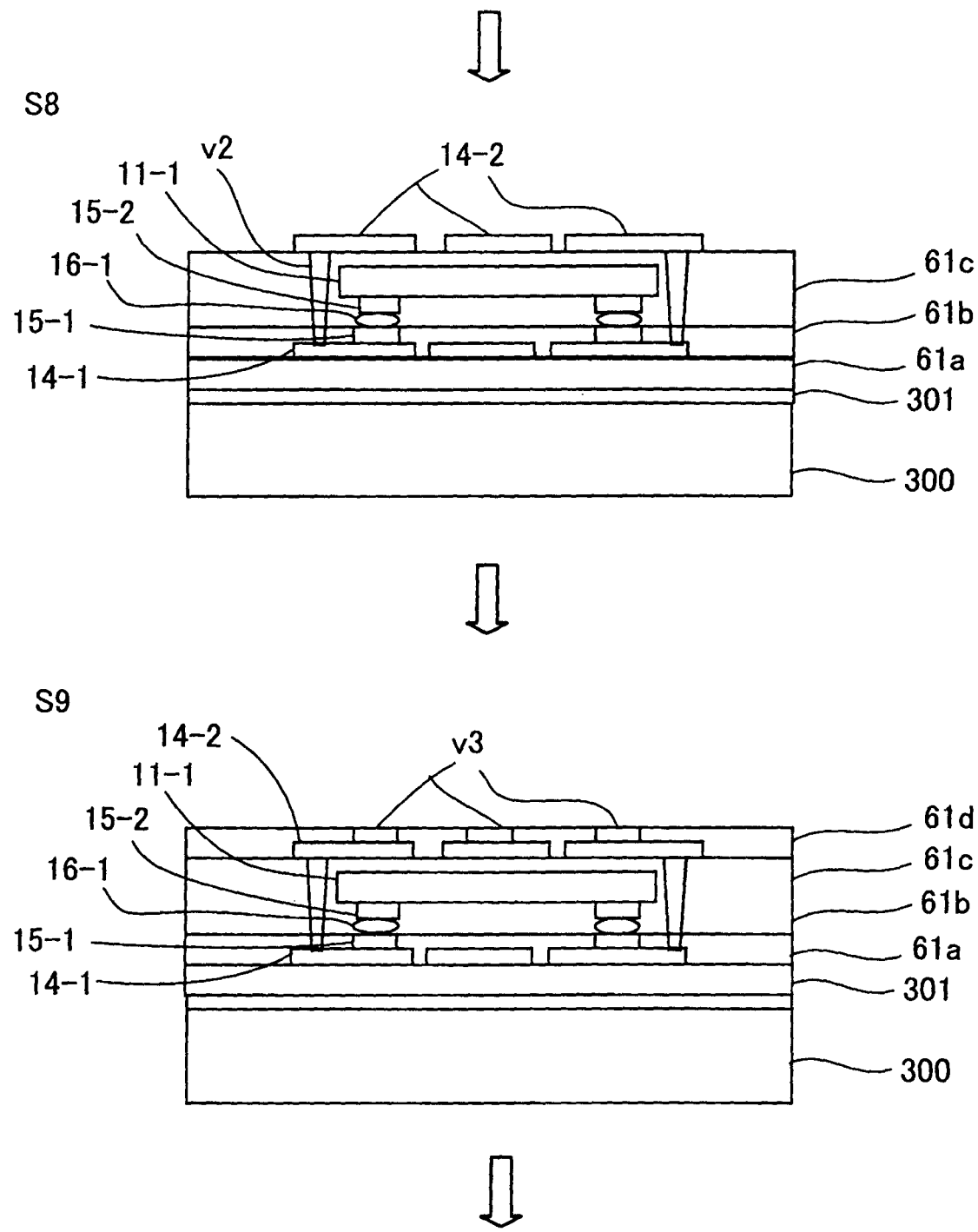
FIG. 26 is a diagram illustrating the flow of manufacturing the image pickup panel.
Figure 27:
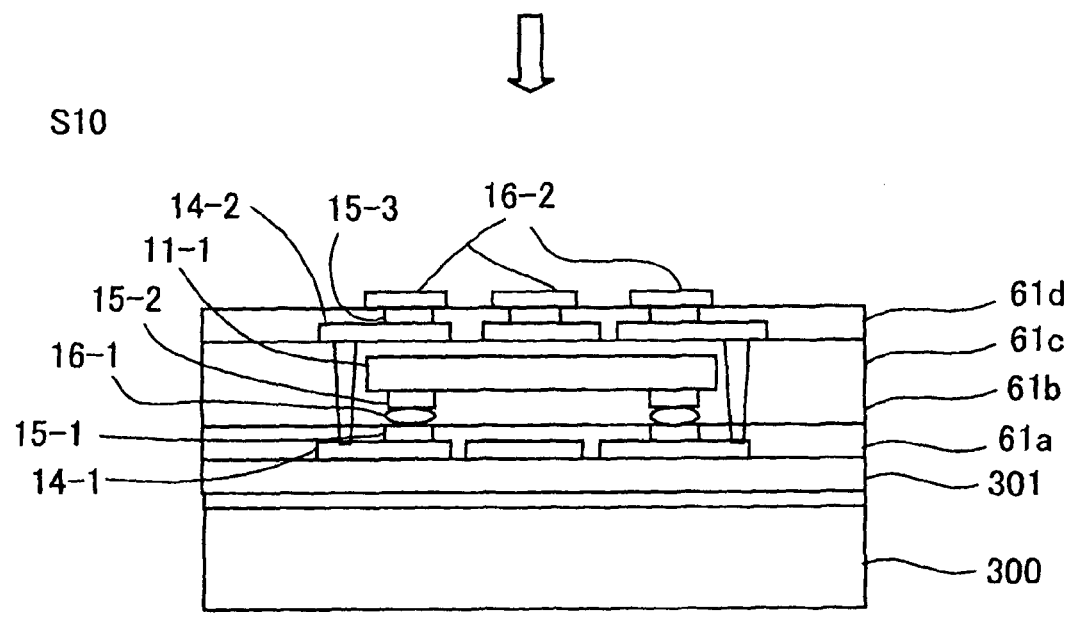
FIG. 27 is a diagram illustrating the flow of manufacturing the image pickup panel.
Figure 27:
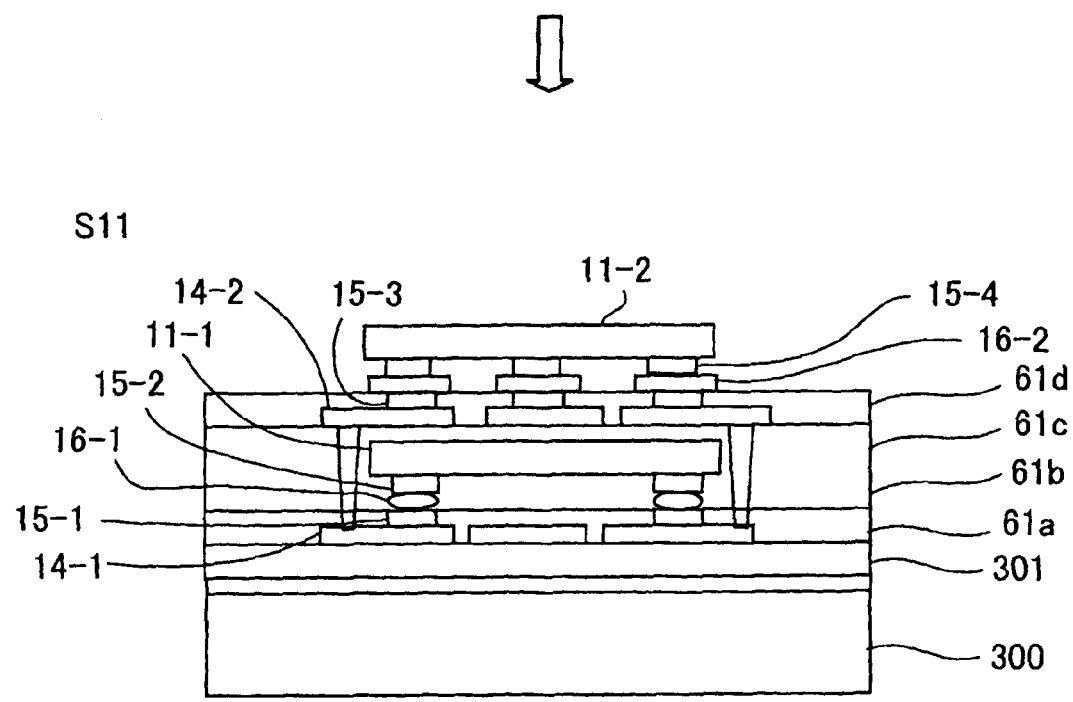
Figure 27:
Figure 28:
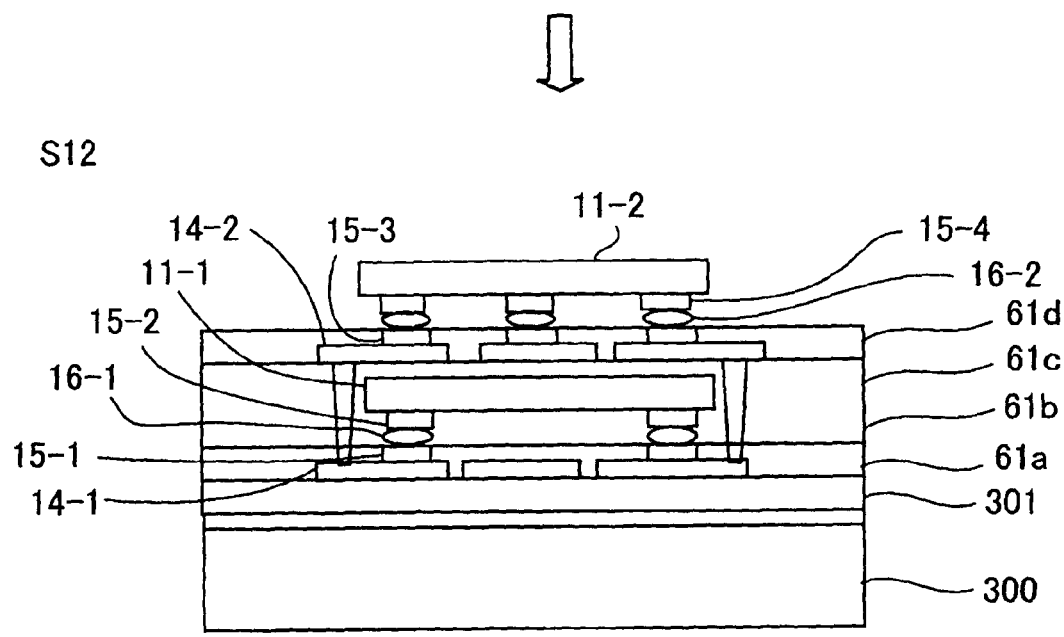
FIG. 28 is a diagram illustrating the flow of manufacturing the image pickup panel.
Figure 28:
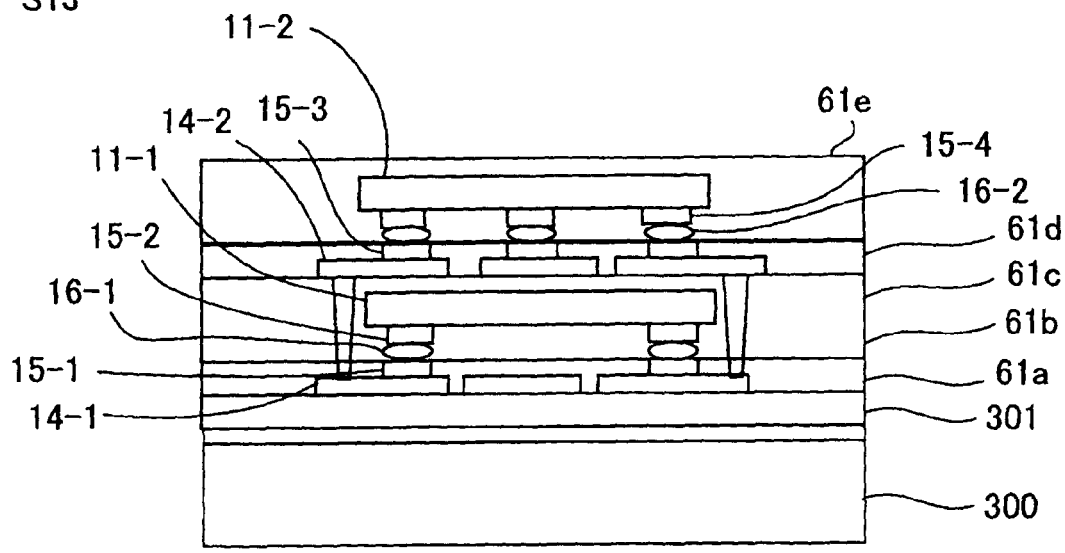
Figure 28:
Figure 29:
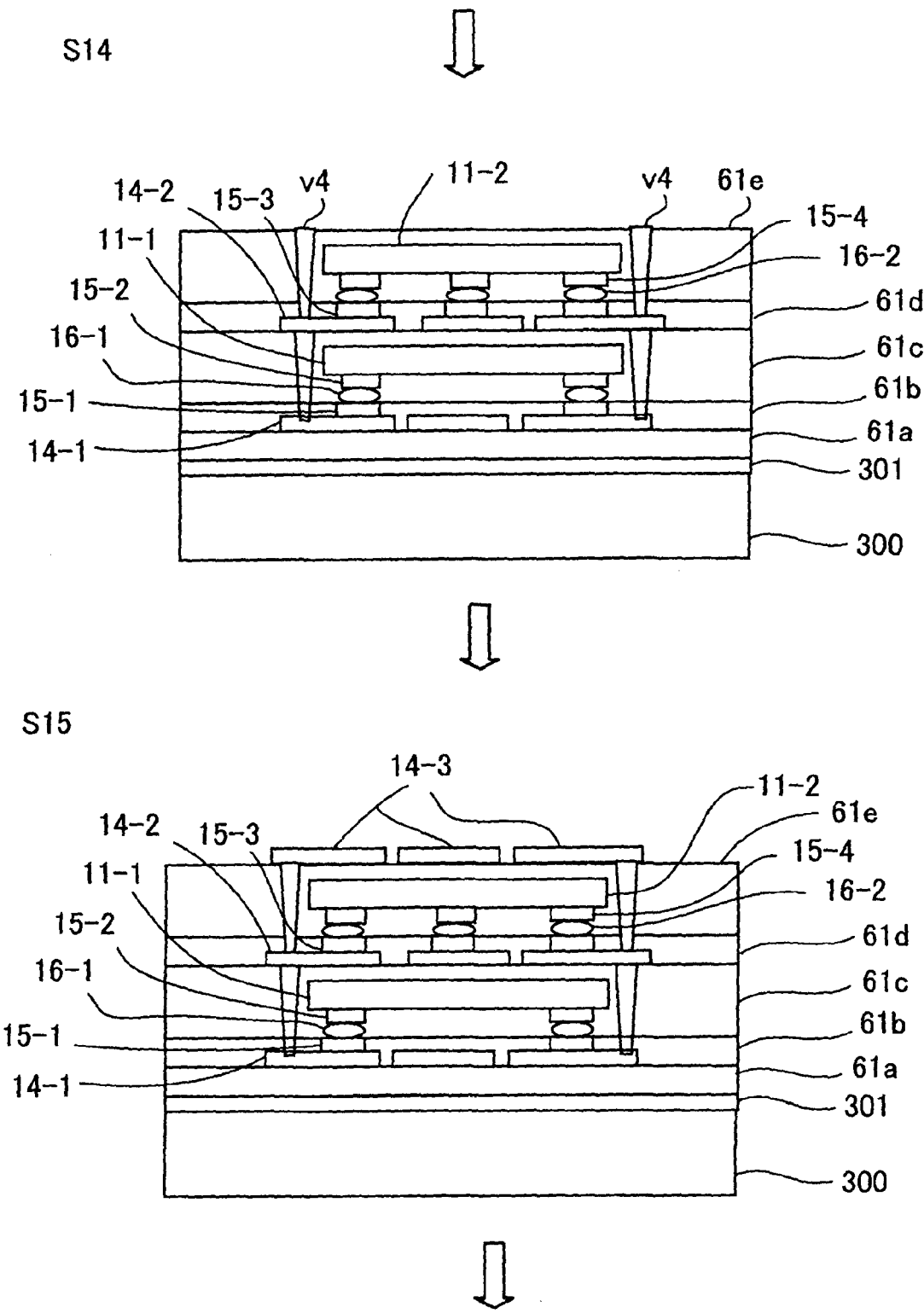
FIG. 29 is a diagram illustrating the flow of manufacturing the image pickup panel.
Figure 30:
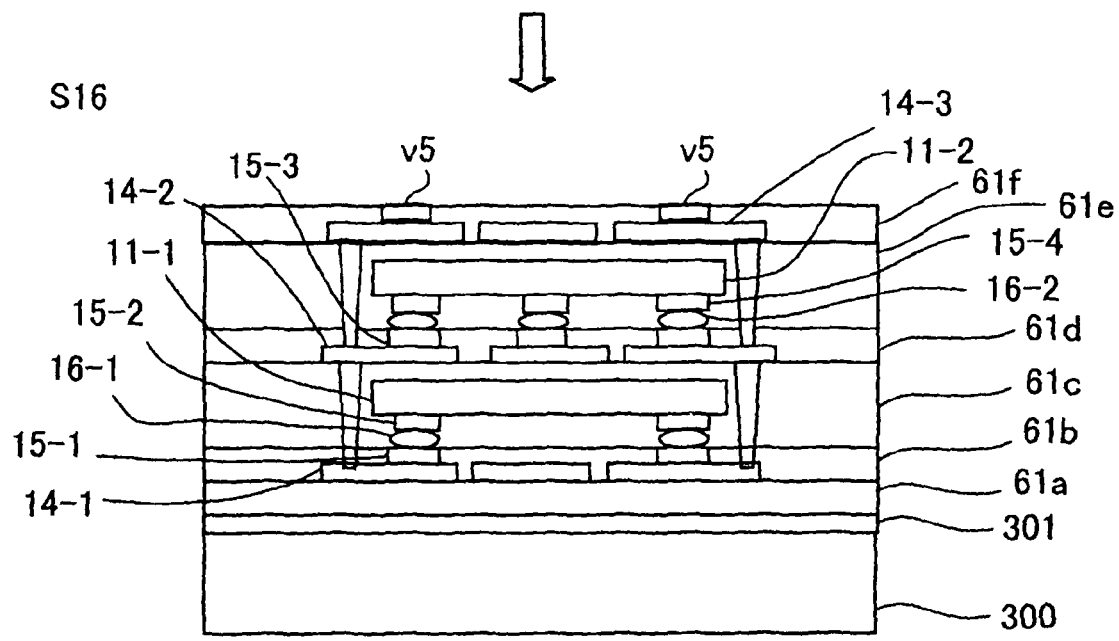
FIG. 30 is a diagram illustrating the flow of manufacturing the image pickup panel.
Figure 30:
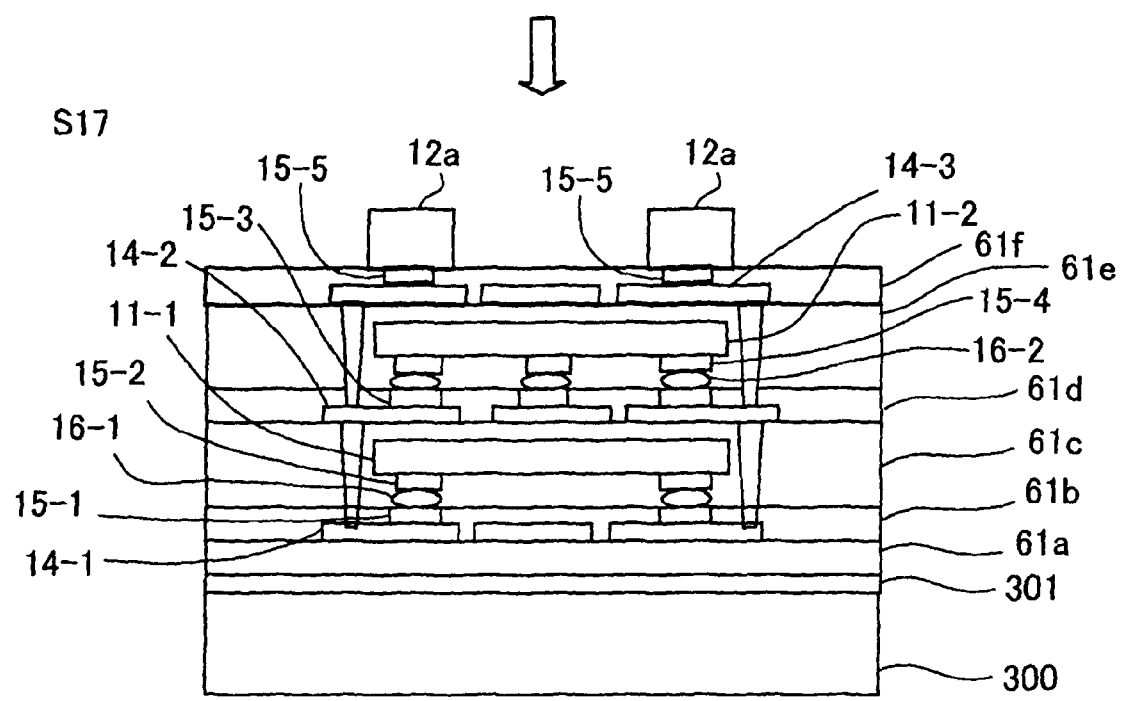
Figure 30:
Figure 31:
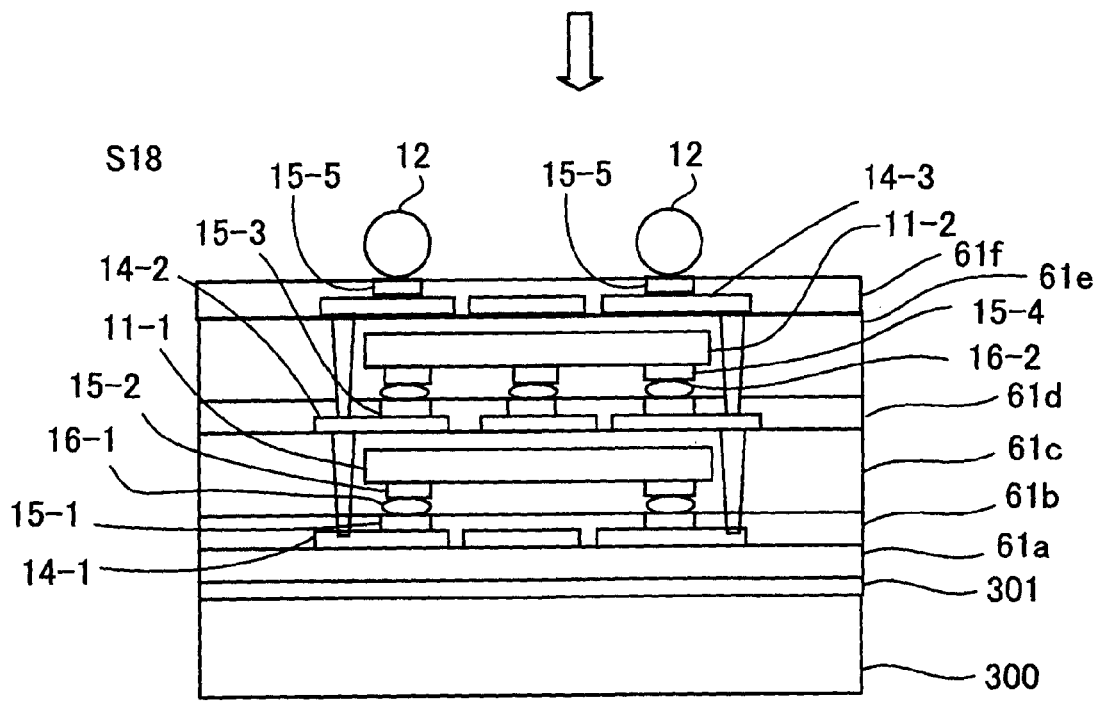
FIG. 31 is a diagram illustrating the flow of manufacturing the image pickup panel.
Figure 31:
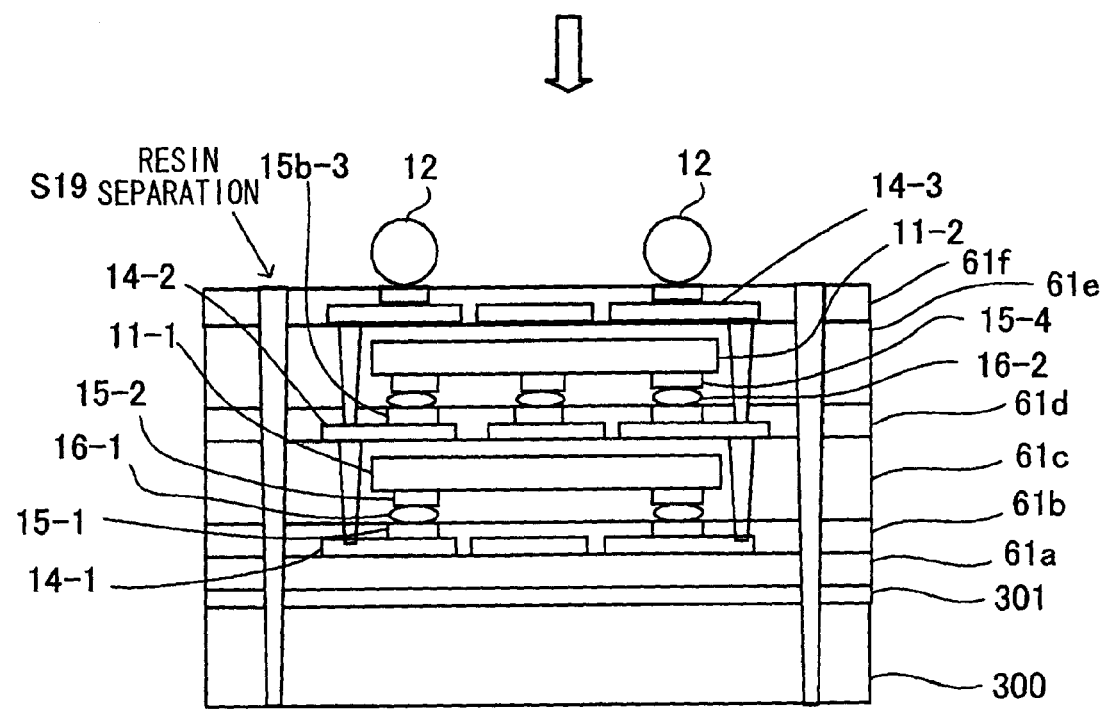
Figure 32:
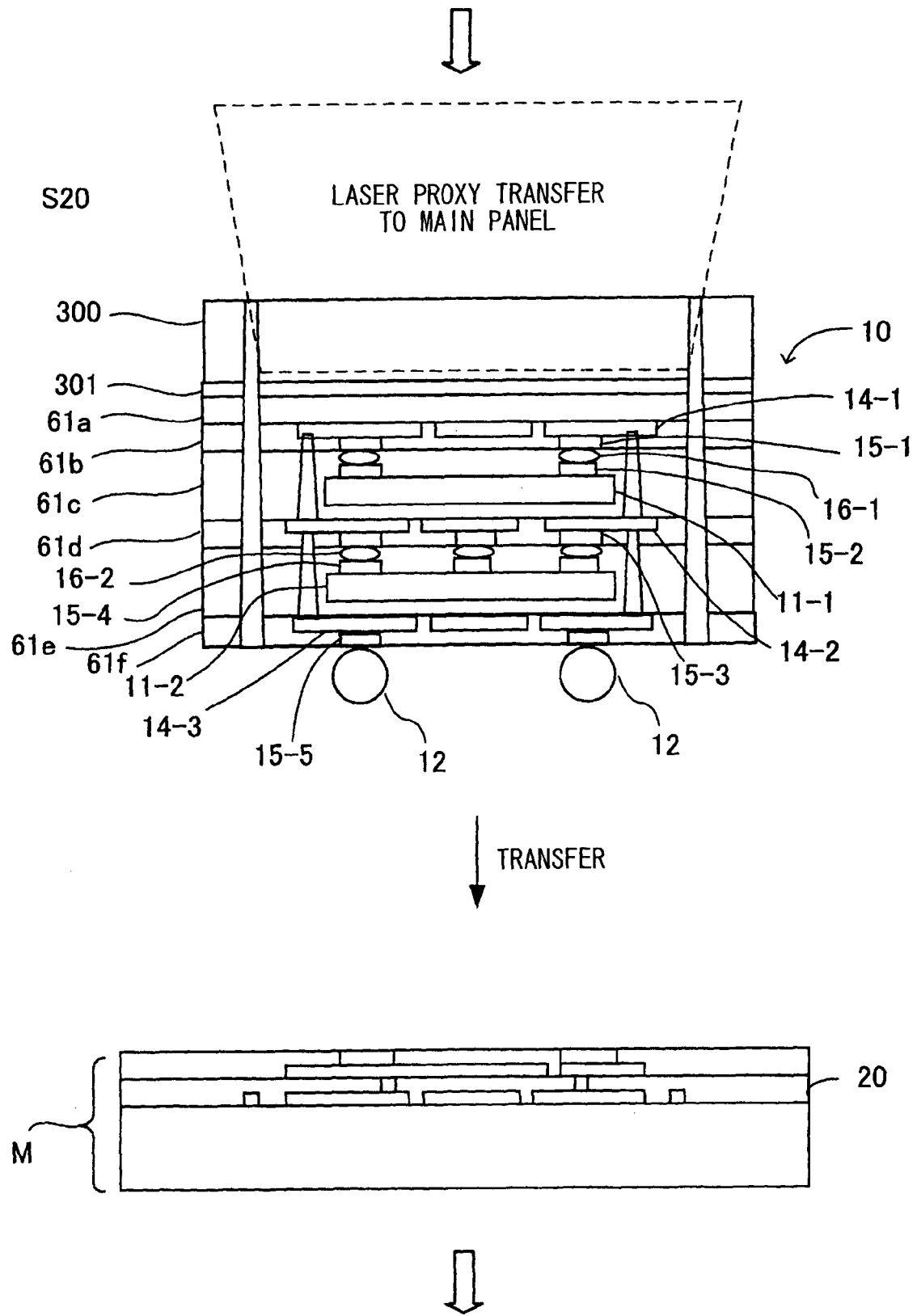
FIG. 32 is a diagram illustrating the flow of manufacturing the image pickup panel.
Figure 33:
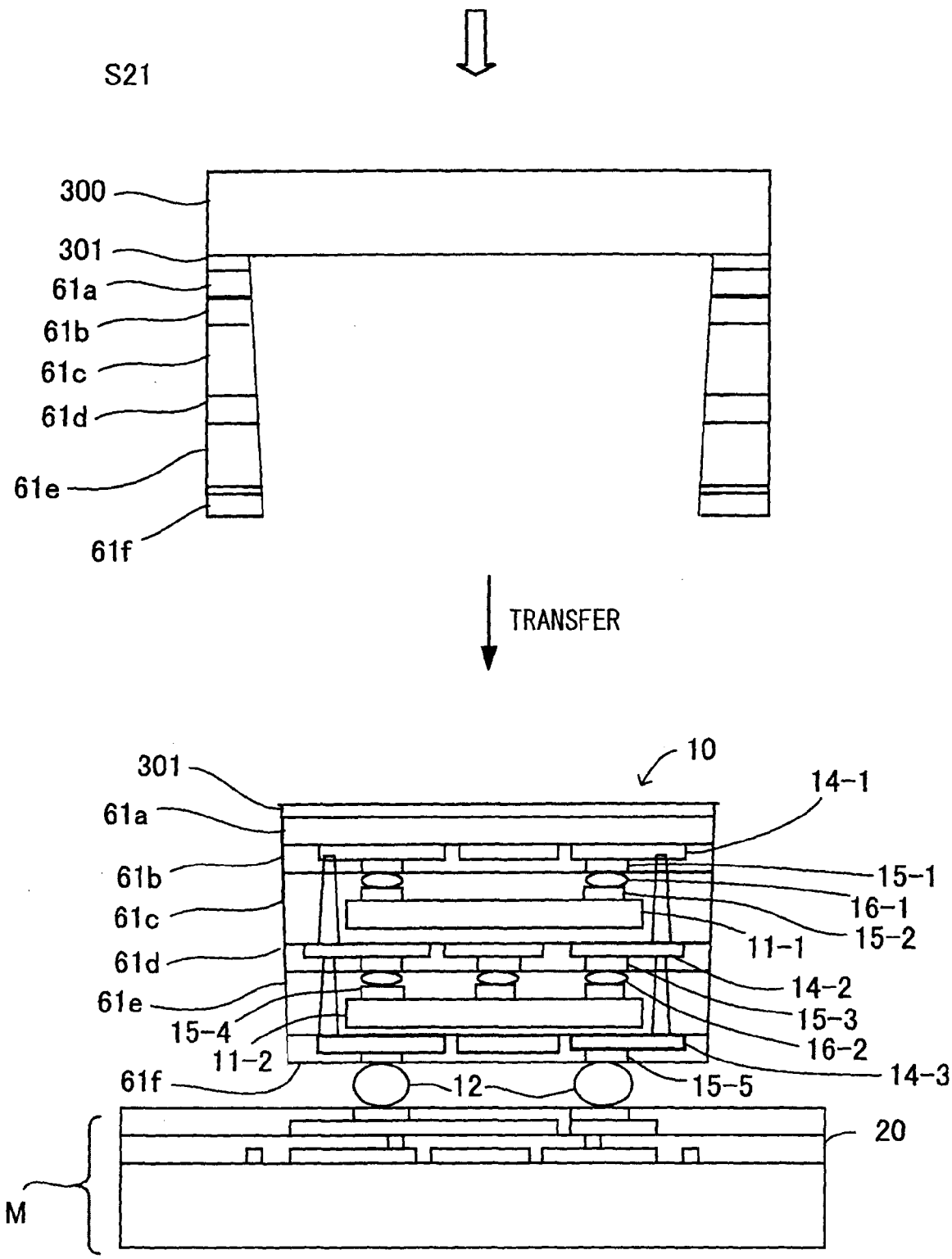
FIG. 33 is a diagram illustrating the flow of manufacturing the image pickup panel.

Next, an image pickup processing system including the image pickup panel 1 will be described below. FIG. 23 is a diagram illustrating a configuration example of the image pickup processing system. An image pickup processing system 8 includes the image pickup panel 1, an interface section 80a, and an image processing section 80 (the interface section 80a may be included in the image processing section 80). The image processing section 80 includes an A/D section 81, a signal processing section 82, and a display control section 83.

The image pickup panel 1 includes the photodetection sections 10 and the wiring layer 20. Each of the photodetection sections 10 includes a photodetector converting received light into a current signal and a receiver converting the current signal into a voltage signal. The photodetector and the receiver are integrally molded, and solder bumps are formed. A wiring pattern connected to the photodetection sections 10 is installed in the wiring layer 20, and the photodetection sections 10 are mounted for respective pixels by the solder bumps.

The interface section 80a is configured of, for example, a flexible substrate, and receives the voltage signal transmitted from the wiring layer 20 to perform an interface process between the wiring layer 20 and the image processing section 80. The A/D section 81 converts the voltage signal into a digital signal. The signal processing section 82 performs signal processing on the digital signal. The display control section 83 performs display control of signal-processed image information. The image processing section 80 corresponds to, for example, a computer terminal such as a personal computer.

Next, a flow of manufacturing the image pickup panel 1 will be described below. FIGS. 24 to 33 are diagrams illustrating the flow of manufacturing the image pickup panel 1.

[S1] A support substrate 300 having a release layer 301 on its surface is prepared.

[S2] An insulating layer 61a is formed on a surface of the release layer 301, and a wiring pattern 14-1 is installed on the insulating layer 61a. Moreover, an insulating layer 61b is formed on the wiring pattern 14-1. At this time, vias v1 are formed in sections directly on the wiring pattern 14-1 of the insulating layer 61b.

[S3] UBMs 15-1 are formed on the vias v1. Moreover, the UBMs 15-1 are subjected to tin (Sn) electrolytic plating, and then solder bumps 16-1 are formed.

[S4] The photodetector 11-1 on which UBMs 15-2 are formed is transferred to the support substrate 300.

[S5] Reflow is performed to melt the solder bumps 16-1 to fix the photodetector 11-1. It is to be noted that Sn plating may be formed on the photodetector 11-1 instead of the UBMs 15-1 in advance.

[S6] Resin potting is performed on the fixed photodetector 11-1 to form an insulating layer 61c.

[S7] Two (the necessary number) via holes v2 are formed through applying laser to the resin (or by a typical dry etching process).

[S8] The via holes v2 are filled with copper plating by, for example, via fill plating. Then, a wiring pattern 14-2 is formed, and the wiring pattern 14-2 and the via holes v2 are connected to each other.

[S9] An insulating layer 61d is formed, and the necessary number of vias v3 are formed directly on the wiring pattern 14-2.

[S10] UBMs 15-3 are formed in the vias v3. Moreover, the UBMs 15-3 are subjected to Sn electrolytic plating, and then solder bumps 16-2 are formed.

[S11] UBMs 15-4 are formed on the solder bumps 16-2, and the receiver 11-2 is transferred to the support substrate 300.

[S12] The solder bumps 16-2 are melted through performing reflow to fix the receiver 11-2. It is to be noted that Sn plating may be formed on the receiver 11-2 instead of the UBMs 15-3 in advance.

[S13] Resin potting is performed on the fixed receiver 11-2 to form an insulating layer 61e.

[S14] Two (the necessary number) via holes v4 are formed through applying laser to the resin (or by a typical dry etching process).

[S15] The via holes v4 is filled with copper plating by, for example, via fill plating. Then, a wiring pattern 14-3 is formed, and the wiring pattern 14-3 and the via holes v4 are connected to each other.

[S16] An insulating layer 61f is formed, and vias v5 are formed directly above the wiring pattern 14-3.

[S17] UBMs 15-5 are formed in the vias v5. Moreover, solder 12a is formed on the UBMs 15-5 by Sn electrolytic plating or the like.

[S18] Reflow is performed to form solder bumps 12.

[S19] Resin separation is performed by laser (or dry etching) to form one chip for one pixel.

[S20] Laser proxy transfer of the photodetection section 10 is performed with respect to a predetermined position of a main panel M where the wiring layer 20 is mounted.

[S21] The photodetection section 10 is separated from the support substrate 300 to be transferred to the main panel M. After that, reflow is performed to melt the solder bumps 12, thereby fixing the photodetection section 10 to the wiring layer 20. It is to be noted that, even if the photodetection section 10 is transferred at a position slightly different from the predetermined position, the position of the photodetection section 10 is automatically adjusted by the above-described solder self-alignment effect through performing reflow or the like.

As described above, in the image pickup panel 1 and the image pickup processing system 8 according to the embodiments of the disclosure, the photodetection sections 10 are arranged on a panel by transfer to produce an image pickup panel; therefore, an increase in the area of the image pickup panel is achievable. Moreover, since the photodetection sections 10 are transferred to a flexible substrate to produce the image pickup panel, a bendable image pickup panel is achievable.

Further, since the photodetection sections 10 are arranged by FC bonding, even if a failure occurs in one of the photodetection sections 10, the photodetection section is easily and appropriately replaced with a new one by solder repair or the like, therefore, a defect-free image pickup panel is achievable.

Moreover, since I/V conversion is performed in the photodetection section 10 to transmit image information by voltage propagation, a signal propagation system is resistant to noise. Further, since a light-focusing configuration by a lens or a total reflection mirror is provided to the light-receiving surface side of the photodetection section 10, photodetection efficiency is improvable, and conversion efficiency from an X-ray to an output signal is improvable accordingly.

It is to be noted that, in the image pickup panel 1, color filters of red, green, blue, and the like are alternately formed on respective photodetection sections to allow the image pickup panel 1 to have a function of a color image pickup panel.

It is to be noted that the present disclosure may have the following configurations.

(1) An image pickup panel including:
photodetection sections each including a photodetector and a receiver which are integrally molded and having solder bumps formed thereon, the photodetector converting received light into a current signal, the receiver converting the current signal into a voltage signal; and
a wiring layer including a wiring pattern installed therein and allowing the photodetection sections to be mounted thereon for respective pixels by the solder bumps, the wiring pattern being connected to the photodetection sections.

(2) The image pickup panel according to (1), further including:
a fluorescent medium covering all of light-receiving surfaces of the photodetection sections arranged on the wiring layer and converting incident radiation rays into light to emit the light;
a first flexible substrate covering the fluorescent medium; and
a second flexible substrate disposed below the wiring layer,
in which the photodetection sections are sealed between the fluorescent medium and the wiring layer.

(3) The image pickup panel according to (1) or (2), in which the photodetection sections each have a two-layer configuration in which the photodetector is disposed in a first layer where light enters and the receiver is disposed in a second layer below the first layer, and the photodetector and the receiver are integrally molded.

(4) The image pickup panel according to any one of (1) to (3), in which the photodetection sections are soldered on the wiring layer, and then each of the photodetection sections is potted with a transparent resin, and light refracted by the transparent resin is focused on a light-receiving surface of each of the photodetection sections.

(5) The image pickup panel according to any one of (1) to (4), further including lens sections each configured through forming a solder bump on a lens which focuses light on a light-receiving surface of each of the photodetection sections, in which the lens sections are soldered for the respective photodetection sections on the wiring layer.

(6) The image pickup panel according to any one of (1) to (5), further including a flexible substrate including protrusions formed on the photodetection section side thereof, the protrusions having tips located for the respective photodetection sections toward light-receiving surfaces of the photodetection sections to totally reflect light emitted from a fluorescent medium, and then to focus the light on the light-receiving surfaces of the photodetection sections, the fluorescent medium covering all of the light-receiving surfaces of the photodetection sections and converting incident radiation rays into light to emit the light,
in which solder bumps are mounted between recessions between any adjacent ones of the protrusions on the flexible substrate and the wiring layer.

(7) The image pickup panel according to any one of (1) and (3) to (6), further including:
a fluorescent medium covering all of light-receiving surfaces of the photodetection sections arranged on the wiring layer and converting incident radiation rays into light to emit the light;
a cover glass substrate covering the fluorescent medium; and
a wiring-side glass substrate disposed below the wiring layer,
in which the photodetection sections are sealed between the fluorescent medium and the wiring layer.

(8) An image pickup processing system including:
an image pickup panel including photodetection sections and a wiring layer, the photodetection sections each including a photodetector and a receiver which are integrally molded and having solder bumps formed thereon, the photodetector converting received light into a current signal, the receiver converting the current signal into a voltage signal, the wiring layer including a wiring pattern installed therein and allowing the photodetection sections to be mounted thereon for respective pixels by the solder bumps, the wiring pattern being connected to the photodetection sections; and
an image processing section including an A/D section converting the voltage signal into a digital signal, a signal processing section performing signal processing on the digital signal, and a display control section performing display control on signal-processed image information.

(9) The image pickup processing system according to (8), further including:
a fluorescent medium covering all of light-receiving surfaces of the photodetection sections arranged on the wiring layer and converting incident radiation rays into light to emit the light;
a first flexible substrate covering the fluorescent medium; and
a second flexible substrate disposed below the wiring layer,
in which the photodetection sections are sealed between the fluorescent medium and the wiring layer.

(10) The image pickup processing system according to (8) or (9), in which the photodetection sections each have a two-layer configuration in which the photodetector is disposed in a first layer where light enters and the receiver is disposed in a second layer below the first layer, and the photodetector and the receiver are integrally molded.

(11) The image pickup processing system according to any one of (8) to (10), in which the photodetection sections are soldered on the wiring layer, and then each of the photodetection sections is potted with a transparent resin, and light refracted by the transparent resin is focused on a light-receiving surface of each of the photodetection sections.

(12) The image pickup processing system according to any one of (8) to (11), further including lens sections each configured through forming a solder bump on a lens which focuses light on a light-receiving surface of each of the photodetection sections, in which the lens sections are soldered for the respective photodetection sections on the wiring layer.

(13) The image pickup processing system according to any one of (8) to (12), further including a flexible substrate including protrusions formed on the photodetection section side thereof, the protrusions having tips located for the respective photodetection sections toward light-receiving surfaces of the photodetection sections to totally reflect light emitted from a fluorescent medium, and then to focus the light on the light-receiving surfaces of the photodetection sections, the fluorescent medium covering all of the light-receiving surfaces of the photodetection sections and converting incident radiation rays into light to emit the light, in which solder bumps are mounted between recessions between any adjacent ones of the protrusions on the flexible substrate and the wiring layer.

(14) The image pickup processing system according to any one of (8) and (10) to (13), further including:

a fluorescent medium covering all of light-receiving surfaces of the photodetection sections arranged on the wiring layer and converting incident radiation rays into light to emit the light;

a cover glass substrate covering the fluorescent medium; and a wiring-side glass substrate disposed below the wiring layer, in which the photodetection sections are sealed between the fluorescent medium and the wiring layer.

It is to be noted that the above-described embodiments may be variously modified without departing from the scope of the embodiments.

Moreover, many modifications and many alternations to the above-described embodiments are possible to those skilled in the art, and the above-described embodiments are not limited to the above-described specific configurations and application examples.

The present disclosure contains subject matter related to that disclosed in Japanese Priority Patent Application No. 2011-274780 filed in the Japan Patent Office on Dec. 15, 2011, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An image pickup panel comprising:
photodetection sections each including a photodetector and a receiver which are integrally molded and having solder bumps formed thereon, the photodetector converting received light into a current signal, the receiver converting the current signal into a voltage signal; and
a wiring layer including a wiring pattern installed therein and allowing the photodetection sections to be mounted thereon for respective pixels by the solder bumps, the wiring pattern being connected to the photodetection sections;
further comprising lens sections each configured through forming a solder bump on a lens which focuses light on a light-receiving surface of each of the photodetection sections,
wherein the lens sections are soldered for the respective photodetection sections on the wiring layer.

2. The image pickup panel according to claim 1, further comprising:
a fluorescent medium covering all of light-receiving surfaces of the photodetection sections arranged on the wiring layer and converting incident radiation rays into light to emit the light;
a first flexible substrate covering the fluorescent medium; and
a second flexible substrate disposed below the wiring layer,
wherein the photodetection sections are sealed between the fluorescent medium and the wiring layer.

3. The image pickup panel according to claim 1, wherein the photodetection sections each have a two-layer configuration in which the photodetector is disposed in a first layer where light enters and the receiver is disposed in a second layer below the first layer, and the photodetector and the receiver are integrally molded.

4. The image pickup panel according to claim 1, wherein the photodetection sections are soldered on the wiring layer, and then each of the photodetection sections is potted with a transparent resin, and light refracted by the transparent resin is focused on a light-receiving surface of each of the photodetection sections.

5. The image pickup panel according to claim 1, further comprising a flexible substrate including protrusions formed on the photodetection section side thereof, the protrusions having tips located for the respective photodetection sections toward light-receiving surfaces of the photodetection sections to totally reflect light emitted from a fluorescent medium, and then to focus the light on the light-receiving surfaces of the photodetection sections, the fluorescent medium covering all of the light-receiving surfaces of the photodetection sections and converting incident radiation rays into light to emit the light,
wherein solder bumps are mounted between recessions between any adjacent ones of the protrusions on the flexible substrate and the wiring layer.

6. The image pickup panel according to claim 1, further comprising:
a fluorescent medium covering all of light-receiving surfaces of the photodetection sections arranged on the wiring layer and converting incident radiation rays into light to emit the light;
a cover glass substrate covering the fluorescent medium; and
a wiring-side glass substrate disposed below the wiring layer,
wherein the photodetection sections are sealed between the fluorescent medium and the wiring layer.

7. An image pickup processing system comprising:
an image pickup panel including photodetection sections and a wiring layer, the photodetection sections each including a photodetector and a receiver which are integrally molded and having solder bumps formed thereon, the photodetector converting received light into a current signal, the receiver converting the current signal into a voltage signal, the wiring layer including a wiring pattern installed therein and allowing the photodetection sections to be mounted thereon for respective pixels by the solder bumps, the wiring pattern being connected to the photodetection sections; and an image processing section including an A/D section converting the voltage signal into a digital signal, a signal processing section performing signal processing on the digital signal, and a display control section performing display control on signal-processed image information;

further comprising lens sections each configured through forming a solder bump on a lens which focuses light on a light-receiving surface of each of the photodetection sections, wherein the lens sections are soldered for the respective photodetection sections on the wiring layer.

8. The image pickup processing system according to claim 7, further comprising:

a fluorescent medium covering all of light-receiving surfaces of the photodetection sections arranged on the wiring layer and converting incident radiation rays into light to emit the light;

a first flexible substrate covering the fluorescent medium; and a second flexible substrate disposed below the wiring layer, wherein the photodetection sections are sealed between the fluorescent medium and the wiring layer.

9. The image pickup processing system according to claim 7, wherein the photodetection sections each have a two-layer configuration in which the photodetector is disposed in a first layer where light enters and the receiver is disposed in a second layer below the first layer, and the photodetector and the receiver are integrally molded.

10. The image pickup processing system according to claim 7, wherein the photodetection sections are soldered on the wiring layer, and then each of the photodetection sections is potted with a transparent resin, and light refracted by the transparent resin is focused on a light-receiving surface of each of the photodetection sections.

11. The image pickup processing system according to claim 7, further comprising a flexible substrate including protrusions formed on the photodetection section side thereof, the protrusions having tips located for the respective photodetection sections toward light-receiving surfaces of the photodetection sections to totally reflect light emitted from a fluorescent medium, and then to focus the light on the light-receiving surfaces of the photodetection sections, the fluorescent medium covering all of the light-receiving surfaces of the photodetection sections and converting incident radiation rays into light to emit the light, wherein solder bumps are mounted between recessions between any adjacent ones of the protrusions on the flexible substrate and the wiring layer.

12. The image pickup processing system according to claim 7, further comprising:

a fluorescent medium covering all of light-receiving surfaces of the photodetection sections arranged on the wiring layer and converting incident radiation rays into light to emit the light;

a cover glass substrate covering the fluorescent medium; and a wiring-side glass substrate disposed below the wiring layer, wherein the photodetection sections are sealed between the fluorescent medium and the wiring layer.

* * * * *